US00RE49167E

(19) United States
(12) Reissued Patent
Mieczkowski et al.

(10) Patent Number: US RE49,167 E
(45) Date of Reissued Patent: Aug. 9, 2022

(54) PASSIVATION STRUCTURE FOR SEMICONDUCTOR DEVICES

(71) Applicant: Wolfspeed, Inc., Durham, NC (US)

(72) Inventors: Van Mieczkowski, Apex, NC (US); Jonathan Young, Fuquay-Varina, NC (US); Qingchun Zhang, Cary, NC (US); John Williams Palmour, Cary, NC (US)

(73) Assignee: WOLFSPEED, INC., Durham, NC (US)

(21) Appl. No.: 16/681,044

(22) Filed: Nov. 12, 2019

Related U.S. Patent Documents

Reissue of:
(64) Patent No.: 9,991,399
Issued: Jun. 5, 2018
Appl. No.: 14/497,568
Filed: Sep. 26, 2014

(51) Int. Cl.
*H01L 29/872* (2006.01)
*H01L 29/06* (2006.01)
(Continued)

(52) U.S. Cl.
CPC ..... *H01L 29/872* (2013.01); *H01L 21/022* (2013.01); *H01L 21/045* (2013.01); *H01L 29/0619* (2013.01); *H01L 29/0692* (2013.01); *H01L 29/1608* (2013.01); *H01L 29/6606* (2013.01); *H01L 29/47* (2013.01); *H01L 29/7395* (2013.01); *H01L 29/744* (2013.01)

(58) Field of Classification Search
None
See application file for complete search history.

(56) References Cited

U.S. PATENT DOCUMENTS 3,895,127 A 7/1975 Comizzoli
3,982,267 A 9/1976 Henry
(Continued)

FOREIGN PATENT DOCUMENTS

EP 1149934 A2 10/2001
EP 1798762 A2 6/2007
(Continued)

OTHER PUBLICATIONS

Summons to Attend Oral Proceedings for European Patent Application 06785888.6, dated Apr. 15, 2014, 7 pages.
(Continued)

*Primary Examiner* — Sean E Vincent
(74) *Attorney, Agent, or Firm* — Withrow & Terranova, P.L.L.C.

(57) ABSTRACT

A Schottky diode is disclosed that includes a silicon carbide substrate, a silicon carbide drift layer, a Schottky contact, and a passivation structure. The silicon carbide drift layer provides an active region and an edge termination region about the active region. The Schottky contact has sides and a top extending between the two sides and includes a Schottky layer over the active region and an anode contact over the Schottky layer. The passivation structure covers the edge termination region, the sides of the Schottky contact, and at least a portion of the top of the Schottky contact. The passivation structure includes a first silicon nitride layer, a silicon dioxide layer over the first silicon nitride layer, and a second silicon nitride layer over the silicon dioxide layer.

51 Claims, 20 Drawing Sheets

(51) Int. Cl.

| | |
|---|---|
| ***H01L 29/16*** | (2006.01) |
| ***H01L 29/66*** | (2006.01) |
| ***H01L 21/04*** | (2006.01) |
| ***H01L 21/02*** | (2006.01) |
| ***H01L 29/47*** | (2006.01) |
| ***H01L 29/739*** | (2006.01) |
| ***H01L 29/744*** | (2006.01) |

(56) References Cited

U.S. PATENT DOCUMENTS 4,551,353 A 11/1985 Hower et al.
4,593,302 A 6/1986 Lidow et al.
4,717,641 A 1/1988 Belmont et al.
4,799,100 A 1/1989 Blanchard et al.
5,332,697 A 7/1994 Smith et al.
5,430,324 A 7/1995 Bencuya
5,466,617 A 11/1995 Shannon
5,605,852 A 2/1997 Bencuya
5,650,638 A 7/1997 Harris et al.
5,686,360 A 11/1997 Harvey, III et al.
5,776,837 A 7/1998 Palmour
5,972,801 A 10/1999 Lipkin et al.
6,001,716 A 12/1999 Liao
6,246,076 B1 6/2001 Lipkin et al.
6,333,255 B1 12/2001 Sekiguchi
6,373,076 B1 * 4/2002 Alok ..... H01L 21/0445 257/76
6,396,090 B1 5/2002 Hsu et al.
6,426,542 B1 7/2002 Tan
6,429,518 B1 8/2002 Endo
6,437,371 B2 8/2002 Lipkin et al.
6,528,373 B2 3/2003 Lipkin et al.
6,586,781 B2 7/2003 Wu et al.
6,610,366 B2 8/2003 Lipkin
6,611,014 B1 8/2003 Kanaya et al.
6,673,662 B2 1/2004 Singh
6,767,843 B2 7/2004 Lipkin et al.
6,774,015 B1 8/2004 Cohen et al.
6,797,586 B2 9/2004 Dev
6,825,501 B2 11/2004 Edmond et al.
6,849,882 B2 2/2005 Chavarkar et al.
6,939,756 B1 9/2005 Chung et al.
7,332,795 B2 2/2008 Smith et al.
7,525,122 B2 4/2009 Ring et al.
7,598,576 B2 10/2009 Ward, III et al.
7,696,584 B2 4/2010 Henning et al.
7,855,401 B2 12/2010 Sheppard et al.
7,858,460 B2 12/2010 Ring et al.
8,247,811 B2 8/2012 Morosawa et al.
8,633,585 B2 1/2014 Schmid et al.
8,680,587 B2 3/2014 Henning et al.
8,994,073 B2 3/2015 Hagleitner et al.
2001/0009788 A1 7/2001 Lipkin et al.
2001/0019168 A1 9/2001 Willer et al.
2001/0023964 A1 9/2001 Wu et al.
2001/0028100 A1 10/2001 Schmitz et al.
2001/0050369 A1 12/2001 Zeng et al.
2002/0011656 A1 1/2002 Swanson et al.
2002/0052076 A1 5/2002 Khan et al.
2002/0121641 A1 9/2002 Alok et al.
2003/0020092 A1 1/2003 Parikh et al.
2003/0025121 A1 2/2003 Edmond et al.
2003/0098497 A1 5/2003 Solayappan et al.
2003/0117066 A1 6/2003 Silvernail
2003/0160274 A1 8/2003 Das et al.
2003/0201453 A2 10/2003 Edmond
2003/0209708 A1 11/2003 Kubota
2004/0084701 A1 5/2004 Kanaya et al.
2004/0099888 A1 5/2004 Sriram
2004/0099928 A1 5/2004 Nunan et al.
2004/0118202 A1 6/2004 Iwaki et al.
2004/0159865 A1 8/2004 Allen et al.
2004/0160118 A1 8/2004 Knollenberg et al.
2004/0202097 A1 10/2004 Oyake et al.
2005/0019971 A1 1/2005 Slater, Jr. et al.
2005/0097941 A1 5/2005 Sandvik et al.
2005/0110042 A1 5/2005 Saito et al.
2005/0133835 A1 6/2005 Bu et al.
2005/0156284 A1 7/2005 Schmidt
2005/0170574 A1 8/2005 Sheppard et al.
2005/0193800 A1 9/2005 DeBoer et al.
2005/0212075 A1 9/2005 Neidig
2005/0221628 A1 10/2005 Tanaka et al.
2005/0258431 A1 11/2005 Smith et al.
2005/0274980 A1 12/2005 Miyoshi
2005/0285233 A1 12/2005 Huang et al.
2006/0006414 A1 1/2006 Germain et al.
2006/0006415 A1 1/2006 Wu et al.
2006/0043379 A1 * 3/2006 Zhang ..... H01L 29/8128 257/77
2006/0043437 A1 3/2006 Mouli
2006/0118892 A1 6/2006 Wu et al.
2006/0145190 A1 7/2006 Salzman et al.
2006/0145283 A1 * 7/2006 Zhu ..... H01L 29/475 257/472
2006/0157733 A1 7/2006 Lucovsky et al.
2006/0191474 A1 8/2006 Chen et al.
2006/0202272 A1 9/2006 Wu et al.
2007/0001174 A1 1/2007 Ring et al.
2007/0001176 A1 1/2007 Ward, III et al.
2007/0018198 A1 1/2007 Brandes et al.
2007/0018199 A1 1/2007 Sheppard et al.
2007/0018272 A1 1/2007 Henning et al.
2007/0164321 A1 7/2007 Sheppard et al.
2007/0164322 A1 7/2007 Smith et al.
2008/0035934 A1 * 2/2008 Sheppard ..... H01L 21/045 257/76
2008/0286968 A1 * 11/2008 Carta ..... H01L 23/3192 438/686
2009/0215280 A1 8/2009 Ring et al.
2010/0193772 A1 8/2010 Morosawa et al.
2010/0193839 A1 8/2010 Takatani et al.
2010/0279092 A1 11/2010 Hwang et al.
2010/0304047 A1 12/2010 Yang et al.
2011/0151173 A1 6/2011 Ramadas et al.
2012/0281452 A1 11/2012 Huo et al.
2012/0319572 A1 12/2012 Lee et al.
2013/0001785 A1 * 1/2013 Nakao ..... H01L 24/05 257/751
2013/0037804 A1 2/2013 Lee et al.
2013/0062619 A1 * 3/2013 Henning ..... H01L 29/0661 257/77
2013/0062723 A1 * 3/2013 Henning ..... H01L 29/8611 257/484
2013/0226268 A1 * 8/2013 Pan ..... A61N 5/0616 607/88
2014/0048781 A1 * 2/2014 Chang ..... H01L 51/5203 257/40
2014/0097469 A1 4/2014 Hagleitner et al.
2014/0145289 A1 * 5/2014 Zhang ..... H01L 29/0619 257/475
2014/0264960 A1 9/2014 Ring et al.
2014/0291697 A1 * 10/2014 Rupp ..... H01L 23/293 257/77
2015/0008447 A1 * 1/2015 Rupp ..... H01L 29/1608 257/77
2015/0115284 A1 * 4/2015 Arthur ..... H01L 21/0465 257/77
2015/0115285 A1 * 4/2015 Kinoshita ..... H01L 29/7839 257/77
2015/0115287 A1 * 4/2015 Tsuji ..... H01L 21/02529 257/77
2015/0372094 A1 * 12/2015 Horii ..... H01L 21/76802 257/77
2016/0093748 A1 3/2016 Mieczkowski et al.

FOREIGN PATENT DOCUMENTS

EP 1972013 A2 9/2008
EP 2031648 A2 3/2009
JP H056886 A 1/1993

(56) References Cited

FOREIGN PATENT DOCUMENTS

| | | | |
|---|---|---|---|
| JP | H05218015 | A | 8/1993 |
| JP | H05234991 | A | 9/1993 |
| JP | 2009094311 | A | 4/2009 |
| JP | 2010109276 | A | 5/2010 |
| TW | 471049 | B | 1/2002 |
| TW | 474024 | B | 1/2002 |
| TW | 579600 | B | 3/2004 |
| WO | 0113436 | A1 | 2/2001 |
| WO | 0249114 | A2 | 6/2002 |
| WO | 03032397 | A2 | 4/2003 |
| WO | 2005076365 | A1 | 8/2005 |
| WO | 2005114743 | A2 | 12/2005 |
| WO | 2005117129 | A1 | 12/2005 |
| WO | 2006098801 | A1 | 9/2006 |
| WO | 2007002860 | A1 | 1/2007 |
| WO | 2007018653 | A2 | 2/2007 |
| WO | 2007018918 | A2 | 2/2007 |
| WO | 2007064689 | A1 | 6/2007 |
| WO | 2007081528 | A2 | 7/2007 |
| WO | 2011125928 | A1 | 10/2011 |

OTHER PUBLICATIONS

International Search Report and Written Opinion for International Patent Application No. PCT/US2006/025447, dated Oct. 5, 2006, 9 pages.
International Preliminary Report on Patentability for International Patent Application No. PCT/US2006/025447, dated Jan. 9, 2008, 7 pages.
Decision to Grant a Patent for Japanese Patent Application No. 2015-535697, dated Feb. 6, 2018, 4 pages.
Non-Final Office Action for U.S. Appl. No. 14/497,568, dated Nov. 6, 2015, 20 pages.
Non-Final Office Action for U.S. Appl. No. 14/497,568, dated May 5, 2016, 19 pages.
Non-Final Office Action for U.S. Appl. No. 14/497,568, dated Oct. 18, 2016, 19 pages.
Final Office Action for U.S. Appl. No. 14/497,568, dated Apr. 3, 2017, 22 pages.
Notice of Allowance for U.S. Appl. No. 14/497,568, dated Sep. 25, 2017, 8 pages.
Notice of Allowance for U.S. Appl. No. 14/497,568, dated Feb. 9, 2018, 9 pages.
Appeal Decision of Refusal for Japanese Patent Application No. 2013-077659, dated Sep. 27, 2016, 21 pages.
Notice of Reasons for Rejection for Japanese Patent Application No. 2015-535697, dated Nov. 15, 2016, 12 pages.
Non-Final Office Action for U.S. Appl. No. 13/804,126, dated Jun. 16, 2016, 10 pages.
Advisory Action and AFCP 2.0 Decision for U.S. Appl. No. 13/804,126, dated Dec. 22, 2015, 4 pages.
Notice of Allowance for U.S. Appl. No. 13/804,126, dated Jun. 15, 2017, 9 pages.
International Preliminary Report on Patentability for PCT/US2013/061798, dated Apr. 16, 2015, 7 pages.
Notice of Allowance for U.S. Appl. No. 11/169,378, dated Jan. 26, 2009, 7 pages.
Notice of Allowance for U.S. Appl. No. 11/169,378, dated Jul. 29, 2008, 7 pages.
Non-Final Office Action for U.S. Appl. No. 11/169,378, dated Dec. 10, 2007, 7 pages.
Restriction Requirement for U.S. Appl. No. 11/169,378, dated Aug. 29, 2007, 5 pages.
Non-Final Office Action for U.S. Appl. No. 11/845,805, dated Apr. 2, 2010, 13 pages.
Notice of Allowance for U.S. Appl. No. 12/404,557, dated Apr. 12, 2010, 6 pages.
Notice of Allowance for U.S. Appl. No. 11/328,550, dated Mar. 30, 2009, 6 pages.
Notice of Allowance for U.S. Appl. No. 11/328,550, dated Oct. 7, 2008, 7 pages.
Non-Final Office Action for U.S. Appl. No. 11/328,550, dated Jun. 27, 2008, 7 pages.
Restriction Requirement for U.S. Appl. No. 11/328,550, dated May 2, 2008, 7 pages.
Notice of Allowance for U.S. Appl. No. 11/462,016, dated Dec. 4, 2009, 8 pages.
Non-Final Office Action for U.S. Appl. No. 11/462,016, dated May 11, 2009, 14 pages.
Restriction Requirement for U.S. Appl. No. 11/462,016, dated Dec. 29, 2008, 7 pages.
Extended European Search Report for European Patent Application No. 08163116.0, dated Jan. 15, 2010, 2 pages.
International Search Report for PCT/US2006/048817, dated Jun. 25, 2007, 3 pages.
Taiwanese Search Report for Taiwanese Patent Application No. 095123557 dated Jan. 15, 2009 1 page.
Notice of Allowance for U.S. Appl. No. 11/845,805, dated Aug. 12, 2010, 6, pages.
Notice of Allowance for U.S. Appl. No. 12/404,557, dated Aug. 19, 2010, 6 pages.
Japanese Office Action for Japanese Patent Application No. 2008-218759 dated May 17, 2012, 9 pages.
Notice of Allowance for U.S. Appl. No. 13/644,506, dated Nov. 7, 2014, 5 pages.
Restriction Requirement for U.S. Appl. No. 13/644,506, dated Oct. 9, 2013, 6 pages.
Examination Report for European Patent Application No. 08163116.0, dated Aug. 30, 2013, 4 pages.
International Search Report and Written Opinion for PCT/US2013/061798, dated Dec. 20, 2013, 10 pages.
Invitation to Pay Additional Fees and Partial Search for PCT/US2014/011286, dated Apr. 23, 2014, 6 pages.
International Search Report and Written Opinion for PCT/US2014/011286, dated Jun. 17, 2014, 16 pages.
Notice of Allowance for U.S. Appl. No. 13/644,506, dated Apr. 15, 2014, 7 pages.
Japanese Office Action for Japanese Patent Application No. 2013-077659, dated Jun. 24, 2014, 6 pages.
Non-Final Office Action for U.S. Appl. No. 13/644,506, dated Dec. 24, 2013, 12 pages.
Notice of Allowance for U.S. Appl. No. 13/644,506, dated Jul. 18, 2014, 7 pages.
Chung, G.Y. et al. "Effect of Nitric Oxide Annealing on the Interface Trap Densities Near the Band Edges in the 4H Polytype of Silicon Carbide," Applied Physics Letters, vol. 76, No. 13, Mar. 27, 2000, pp. 1713-1715.
Ganem, J.J. et al., "NRA and XPS Characterizations of Layers Formed by Rapid Thermal Nitridation of Thin SIO2 Films," Nuclear Instruments & Methods in Physics Research, Section B: Beam Interactions with Materials and Atoms, vol. 1364, No. 1-4, 1992, pp. 744-749.
Li, H.F. et al., "Improving SiO2 Grown on P-type 4H-SiC by NO Annealing," Materials Science Forum, vol. 264-268, 1998, pp. 869-872.
Lipkin et al., "Improved Oxidation Procedures for Reduced SiO2/SiC defects," Journal of Electronic Materials, vol. 25, No. 5, 1996, pp. 909-915.
Ohno, Y. et al., "Effects of Surface Passivation on Breakdown of AlGaN/GaN High-Electron-Mobility Transistors," Applied Physics Letters, vol. 84, No. 12, Mar. 22, 2004, pp. 2184-2186.
Notice of Preliminary Rejection for Korean Patent Application No. 10-2015-7011180, dated Jul. 28, 2016, 10 pages.
Examination Report for European Patent Application No. 08163116.0, dated Oct. 14, 2015, 4 pages.
Pre-appeal Reexamination Report for Japanese Patent Application No. 2013-077659, dated Sep. 28, 2015, 4 pages.
International Preliminary Report on Patentability for PCT/US2014/011286, dated Sep. 24, 2015, 11 pages.
Decision to Refuse for European Patent Application No. 06 785 888.6, dated Jul. 16, 2015, 13 pages.

(56) References Cited

OTHER PUBLICATIONS

Final Office Action for U.S. Appl. No. 13/804,126, dated Aug. 28, 2015, 9 pages.
Decision of Rejection for Japanese Patent Application No. 2013-077659, dated Mar. 3, 2015, 8 pages.
Non-Final Office Action for U.S. Appl. No. 13/804,126, dated Jan. 29, 2015, 10 pages.
Final Office Action for U.S. Appl. No. 13/804,126, dated Feb. 9, 2017, 9 pages.
Notice of Allowance for Korean Patent Application No. 10-2015-7011180, dated Jan. 26, 2017, 4 pages.
Examination Report for European Patent Application No. 13774322.5, dated May 31, 2017, 6 pages.
Notice of Reasons for Rejection for Japanese Patent Application No. 2015-535697, dated Aug. 1, 2017, 5 pages.
Corrected Notice of Allowability for U.S. Appl. No. 13/804,126, dated Aug. 14, 2017, 4 pages.
Corrected Notice of Allowability for U.S. Appl. No. 13/804,126, dated Sep. 12, 2017, 5 pages.

* cited by examiner

PASSIVATION STRUCTURE FOR SEMICONDUCTOR DEVICES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

*The present application is a reissue of U.S. Pat. No. 9,991,399, entitled "PASSIVATION STRUCTURE FOR SEMICONDUCTOR DEVICES."*

[This application] *U.S. Pat. No. 9,991,399* is related to U.S. Pat. No. 7,525,122, entitled PASSIVATION OF WIDE BAND-GAP BASED SEMICONDUCTOR DEVICES WITH HYDROGEN-FREE SPUTTERED NITRIDES; U.S. Pat. No. 7,855,401, entitled PASSIVATION OF WIDE BAND-GAP BASED SEMICONDUCTOR DEVICES WITH HYDROGEN-FREE SPUTTERED NITRIDES; U.S. Pat. No. 7,858,460, entitled PASSIVATION OF WIDE BAND-GAP BASED SEMICONDUCTOR DEVICES WITH HYDROGEN-FREE SPUTTERED NITRIDES; U.S. Pat. No. 7,598,576, entitled ENVIRONMENTALLY ROBUST PASSIVATION STRUCTURES FOR HIGH-VOLTAGE SILICON CARBIDE SEMICONDUCTOR DEVICES; U.S. Pat. No. 7,696,584, entitled REDUCED LEAKAGE POWER DEVICES BY INVERSION LAYER SURFACE PASSIVATION; U.S. patent application Ser. No. 13/644,506, filed Oct. 4, 2012, *now U.S. Pat. No. 8,994,073*, entitled HYDROGEN MITIGATION SCHEMES IN THE PASSIVATION OF ADVANCED DEVICES; and U.S. patent application Ser. No. 13/804,126, filed Mar. 14, 2013, *now U.S. Pat. No. 9,812,338*, entitled ENCAPSULATION OF ADVANCED DEVICES USING NOVEL PECVD AND ALD SCHEMES, the disclosures of which are incorporated herein by reference in their entireties.

FIELD OF THE DISCLOSURE

The present disclosure relates to semiconductor devices, and in particular to passivation of such devices.

BACKGROUND

Semiconductor devices, such as Schottky diodes and field effect transistors (FETs), are often used in systems that are exposed to a variety of harsh environmental conditions. In addition to being exposed to extreme temperature and humidity ranges as well as a host of environmental elements, such as water, oxygen, and hydrogen, the devices are often required to operate at or near their rated currents and voltages over extended periods of time. Operating in extreme environmental conditions and at elevated levels often leads to deterioration in performance and failure of the devices.

Surface passivation techniques are employed to encapsulate sensitive surfaces of the devices in an effort to reduce the deteriorating affects associated with being exposed to extreme environmental conditions and operating at elevated levels. While current passivation techniques have proven to be beneficial, there is substantial room for improvement. As such, there is a need for more effective passivation techniques in order to improve device reliability under extreme environmental conditions and elevated operating levels.

SUMMARY

A Schottky diode is disclosed that includes a silicon carbide substrate, a silicon carbide drift layer, a Schottky contact, and a passivation structure. The silicon carbide drift layer provides an active region and an edge termination region about the active region. The Schottky contact has sides and a top extending between the two sides and includes a Schottky layer over the active region and an anode contact over the Schottky layer. The passivation structure covers the edge termination region, the sides of the Schottky contact, and at least a portion of the top of the Schottky contact. The passivation structure includes a first silicon nitride layer, a silicon dioxide layer over the first silicon nitride layer, and a second silicon nitride layer over the silicon dioxide layer.

In one embodiment, an oxide layer is provided between the passivation structure and the silicon carbide drift layer. The oxide layer extends outward from the sides of the Schottky contact over the edge termination region. The oxide layer may be silicon dioxide. The oxide layer may be thermally grown while the first silicon nitride layer, the silicon dioxide layer, and the second silicon nitride layer of the passivation structure may be deposited over the thermally grown oxide layer during a single plasma enhanced chemical vapor deposition (PECVD) process.

In another embodiment, the thickness of the first silicon nitride layer is greater than the thickness of the second silicon nitride layer, and the thickness of the second silicon nitride layer is greater than the thickness of the silicon dioxide layer. For example, the thickness of the first silicon nitride layer may be between about 6400 and 9600 Angstroms, the thickness of the silicon dioxide layer may be between about 900 and 1100 Angstroms, and the thickness of the second silicon nitride layer may be between about 2400 and 3600 Angstroms. Further, an index of refraction for the first silicon nitride layer may be between about 1.95 and 2.15, an index of refraction for the silicon dioxide layer may be between about 1.45 and 1.5, and an index of refraction for the second silicon dioxide layer may be between about 1.95 and 2.15.

The performance of the disclosed Schottky diodes have exceeded expectations. For example, Schottky diodes that have a rated reverse breakdown voltage of at least 600 volts are capable of operating at 80% of the rated reverse breakdown voltage, at 85% humidity, and at 85 Celsius for at least 1000 hours without failing. This represents a very impressive order of magnitude improvement in longevity over state-of-the art devices.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
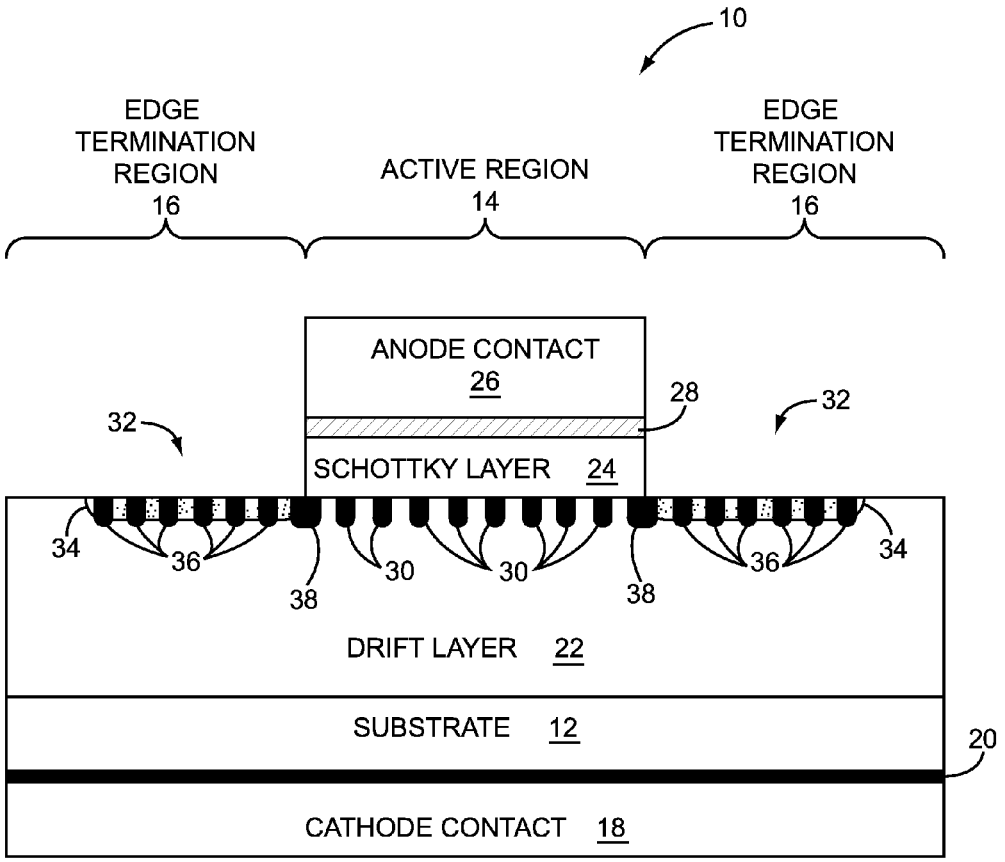
FIG. 1 is a cross-sectional view of a Schottky diode, without the passivation structure, according to one embodiment of the disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Notably, the embodiments described herein reference various semiconductor layers or elements therein as being doped with an N-type or P-type doping material. Being doped with an N-type or P-type material indicates that the layer or element has either an N-type or P-type conductivity, respectively. N-type material has a majority equilibrium concentration of negatively charged electrons, and P-type material has a majority equilibrium concentration of positively charged holes. The doping concentrations for the various layers or elements may be defined as being lightly, normally, or heavily doped. These terms are relative terms intended to relate doping concentrations for one layer or element to another layer or element.

Further, the following description focuses on an N-type substrate and drift layer being used in a Schottky diode; however, the concepts provided herein equally apply to Schottky diodes with P-type substrates and drift layers. As such, the doping charge for each layer or element in the disclosed embodiments may be reversed to create Schottky diodes with P-type substrates and drift layers. Further, any of the layers described herein may be formed from one or more epitaxial layers using any available technique, and additional layers that are not described may be added between those described herein without necessarily departing from the concepts of the disclosure.

The passivation concepts disclosed herein are described as being applied to a Schottky diode that is formed on a silicon carbide (SiC) substrate. However, these passivation concepts are applicable to virtually any type of semiconductor device, including non-Schottky-type diodes as well as bipolar and field effect transistors, which are implemented in a variety of material systems. Initially, an overview of an exemplary Schottky diode is provided in association with FIGS. 1 through 6A and 6B. An exemplary state-of-the-art passivation technique is described in association with FIG. 7, and an improved passivation technique is described in association with FIG. 8. Details of the various structural and functional aspects of the improved passivation technique as well as an exemplary process for fabrication of the Schottky diode with the improved passivation technique are described in association with FIGS. 9 through 23.

With reference to FIG. 1, an exemplary Schottky diode 10 is formed on a substrate 12 and has an active region 14 that resides within an edge termination region 16 that may, but does not need to, completely or substantially surround the active region 14. Along the bottom side of the substrate 12, a cathode contact 18 is formed and may extend below both the active region 14 and the edge termination region 16. A cathode ohmic layer 20 may be provided between the substrate 12 and the cathode contact 18 to facilitate a low impedance coupling therebetween. A drift layer 22 extends along the top portion of the substrate 12. The drift layer 22, the cathode contact 18, and the cathode ohmic layer 20 may extend along both the active region 14 and the edge termination region 16.

In the active region 14, a Schottky layer 24 resides over the top surface of the drift layer 22, and an anode contact 26 resides over the Schottky layer 24. A barrier layer 28 may be provided between the Schottky layer 24 and the anode contact 26 to prevent material of the Schottky layer 24 from diffusing into material of the anode contact 26, and vice versa. Notably, the active region 14 substantially corresponds to the region where the Schottky layer 24 of the Schottky diode 10 resides over the drift layer 22. For purposes of illustration only, assume the substrate 12 and the drift layer 22 are silicon carbide (SiC). Other materials for these and other layers of the Schottky diode 10 are discussed further below.

In the illustrated embodiment, the substrate 12 is heavily doped and the drift layer 22 is relatively lightly doped with an N-type material. The drift layer 22 may be substantially uniformly doped or doped in a graded fashion. For example, doping concentrations of the drift layer 22 may transition from being relatively more heavily doped near the substrate 12 to being more lightly doped near the top surface of the drift layer 22 that is proximate the Schottky layer 24. Doping details are provided further below.

Beneath the Schottky layer 24, a plurality of junction-barrier (JB) elements 30 are provided along the top surface of the drift layer 22. Doping select regions in the drift layer 22 with P-type material forms these JB elements 30. As such, each JB element 30 extends from the top surface of the drift layer 22 into the drift layer 22. Together, the JB elements 30 form a JB array.

Figure 2:
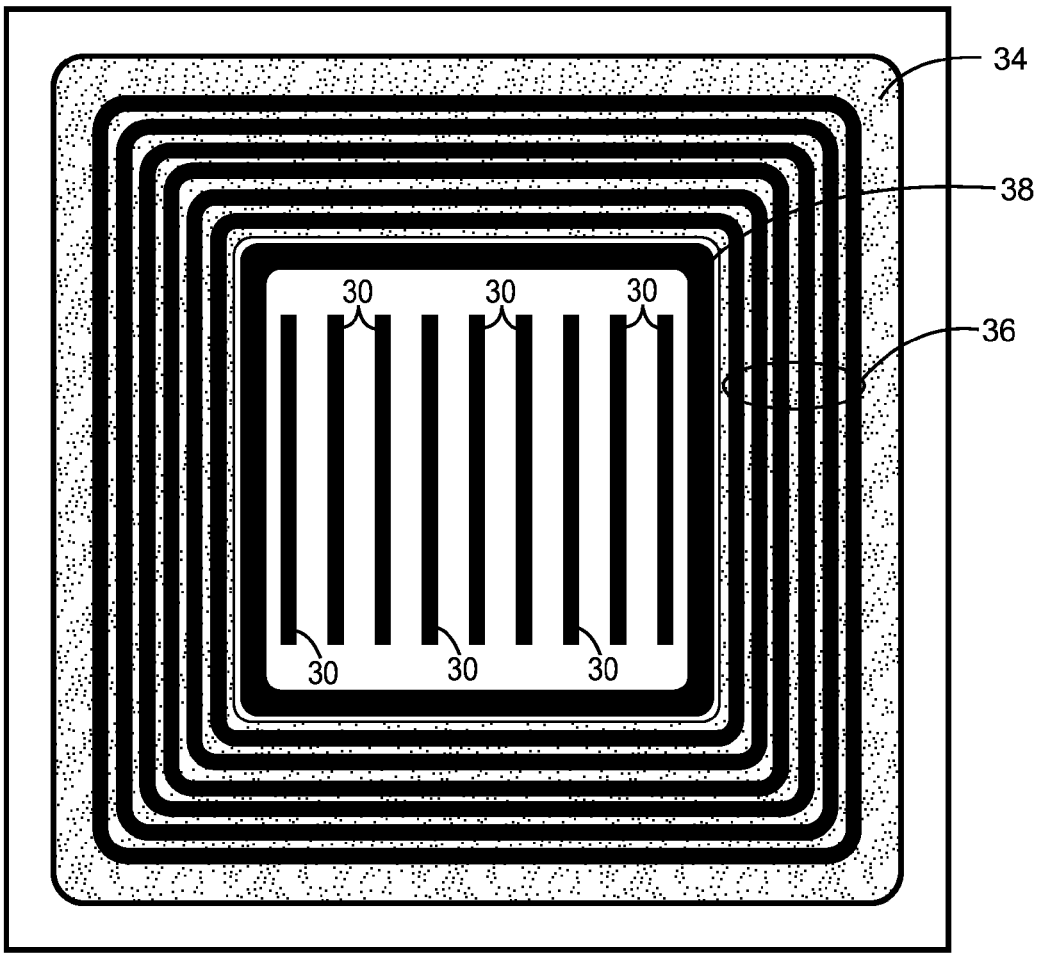
FIG. 2 is a top view of a Schottky diode, without the Schottky layer and anode contact, according to one embodiment of the disclosure.
Figure 3:
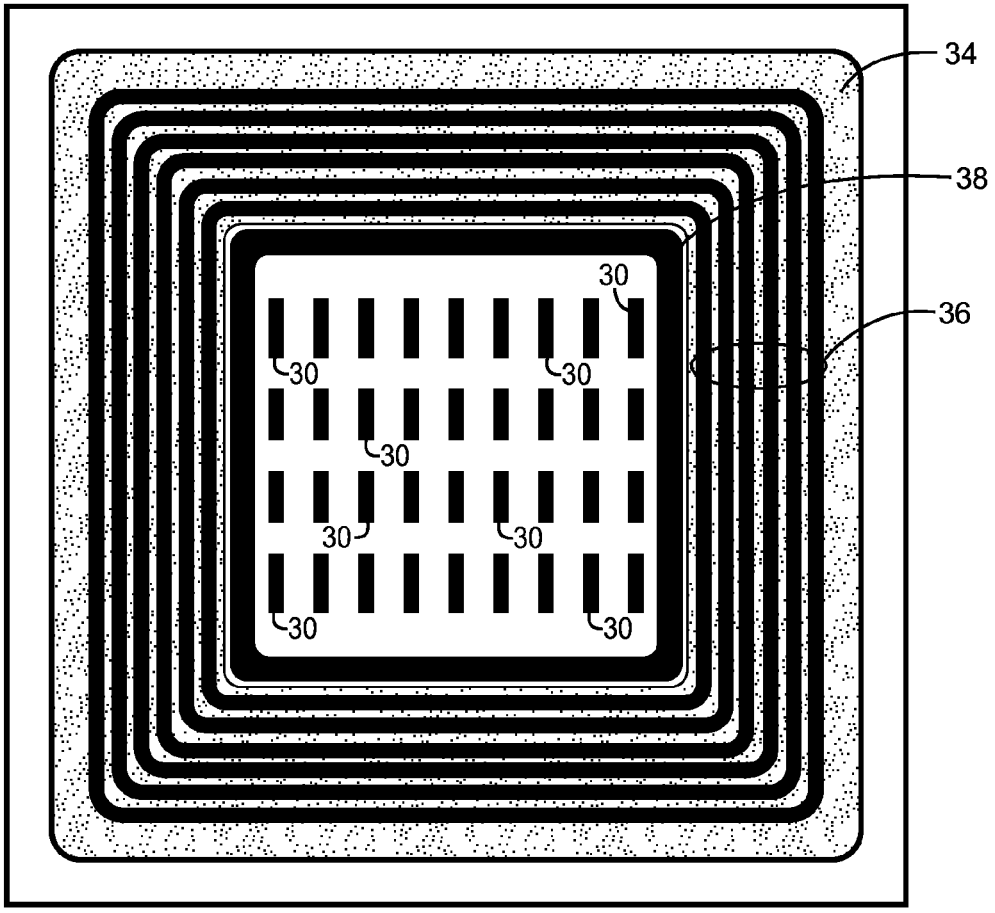
FIG. 3 is a top view of a Schottky diode, without the Schottky layer and anode contact, according to a second embodiment of the disclosure.
Figure 4:
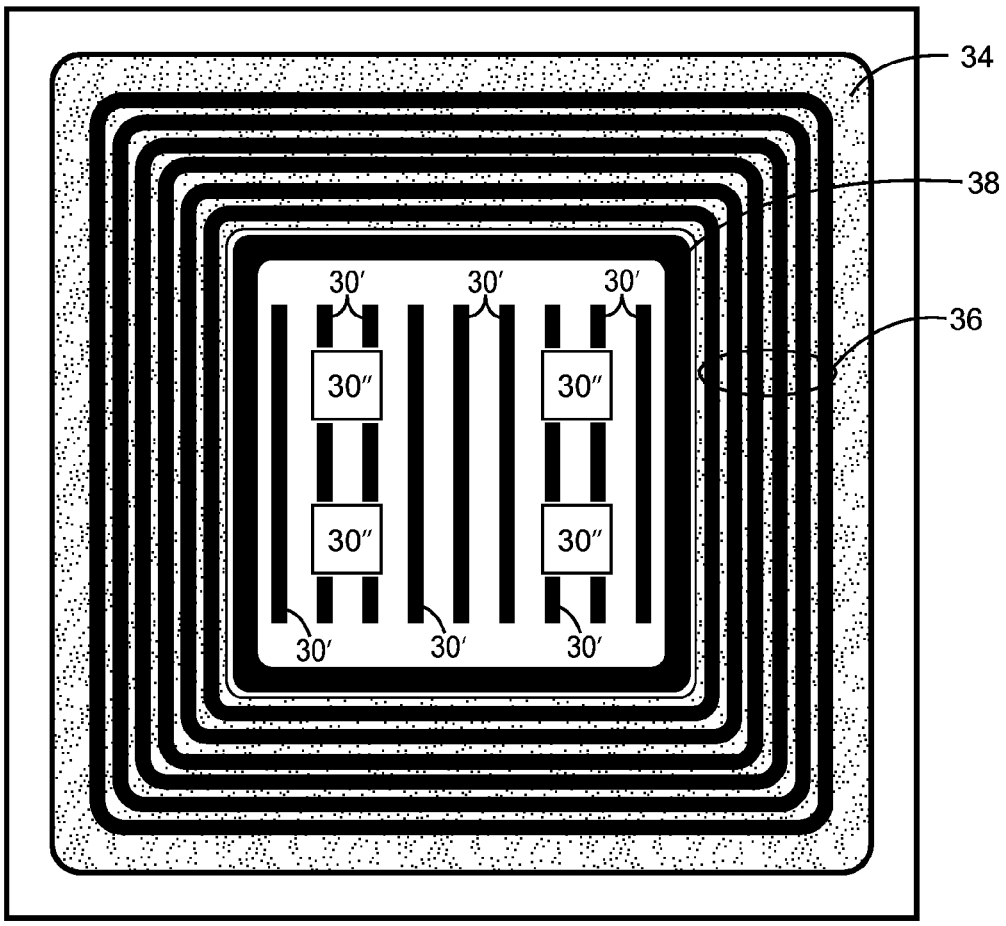
FIG. 4 is a top view of a Schottky diode, without the Schottky layer and anode contact, according to a third embodiment of the disclosure.
Figure 5:
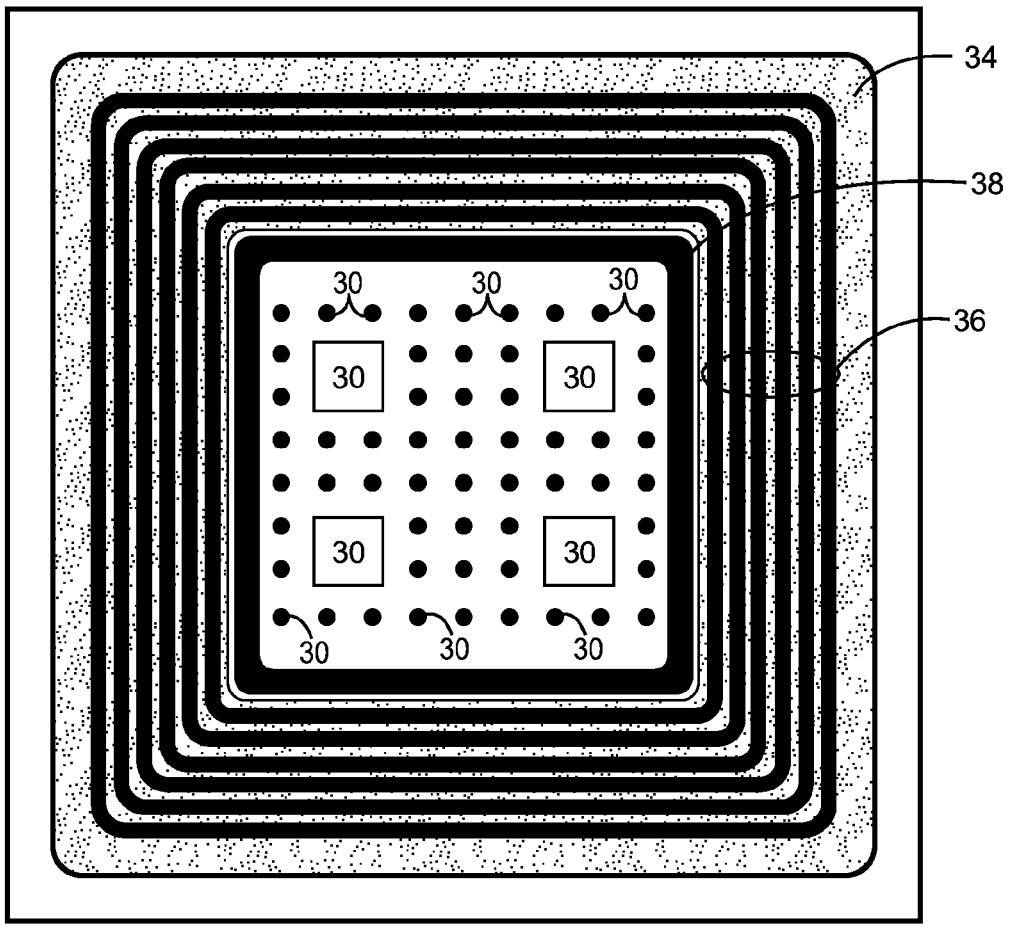
FIG. 5 is a top view of a Schottky diode, without the Schottky layer and anode contact, according to a fourth embodiment of the disclosure.

The JB elements 30 may take on various shapes, as illustrated in FIGS. 2 through 5. In FIG. 2, each JB element 30 is a single, long, elongated stripe that extends substantially across the active region 14, wherein the JB array is a plurality of parallel JB elements 30. In FIG. 3, each JB element 30 is a short, elongated dash, wherein the JB array has parallel rows of multiple dashes that are linearly aligned to extend across the active region 14. In FIG. 4, the JB elements 30 include a plurality of elongated stripes (30') and a plurality of islands (30"). As described further below, the elongated stripes and the islands may have substantially the same or substantially different doping concentrations. In FIG. 5, the JB elements 30 include an array of smaller, circular islands with a plurality of larger, rectangular islands dispersed evenly with the array of smaller, circular islands. Other shapes and configurations of the JB elements 30 and the ultimate JB array that is formed therefrom will be appreciated by those skilled in the art after reading the disclosure provide herein.

With continued reference to FIGS. 1 through 5, the edge termination region 16 includes a structure that is formed in the top surface of the drift layer 22 and substantially surrounds the active region 14. This structure is referred to as the edge termination structure 32. At least one well 34 is formed in a portion of the drift layer 22 that resides below the bottom surface of the edge termination structure 32. The well 34 is formed by lightly doping a portion of the drift layer 22 that extends into the drift layer 22 from the top surface of the drift layer 22 with a P-type material. Within the well 34, a plurality of concentric guard rings 36 are formed. The guard rings 36 are formed by heavily doping the corresponding portions of the well 34 with a P-type doping material. As illustrated, the guard rings 36 are spaced apart from one another and may extend from the top surface of the drift layer 22, through the well 34, and past the bottom of the well 34.

In addition to the guard rings 36 that reside in the edge termination structure 32, an edge guard ring 38 may be provided in the top surface of the drift layer 22 and around the periphery of the active region 14. The edge guard ring 38 effectively resides between the JB elements 30 of the active region 14 from the guard rings 36 of the edge termination structure 32. The edge guard ring 38 is formed by heavily doping the corresponding portions of the drift layer 22 with a P-type material, such that the edge guard ring 38 is formed about the periphery of the active region 14 and extends into the drift layer 22. While illustrated as substantially rectangular in FIGS. 2 through 5, the edge termination structure 32, the guard rings 36, and the edge guard ring 38 may be of any shape and will generally correspond to the shape of the periphery of the active region 14, which is rectangular in the illustrated embodiments. Each of these three elements may provide a continuous or broken (i.e. dashed, dotted, or the like) loop about the active region 14.

Figure 6A:
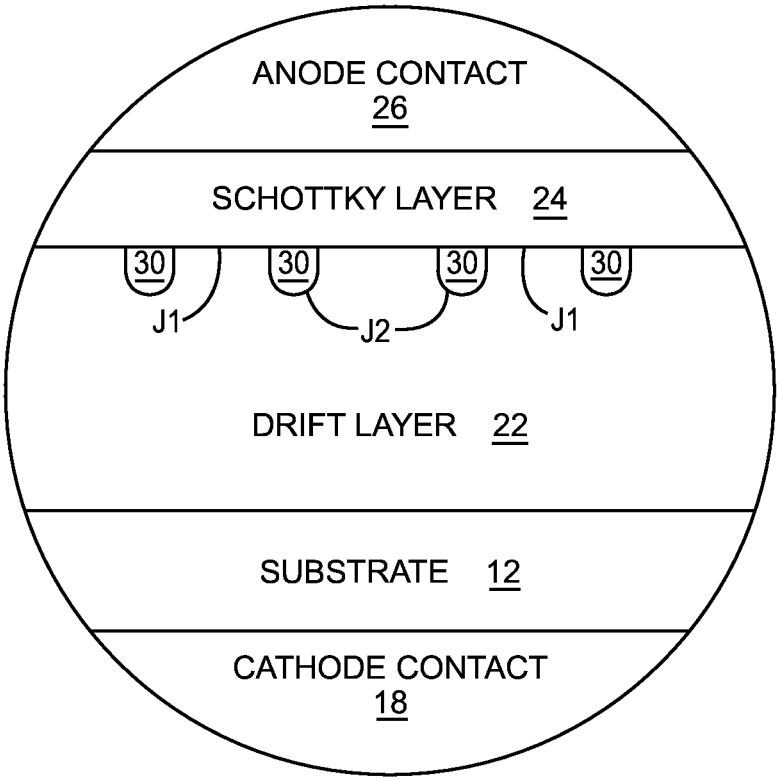
FIG. 6A is a partial cross-sectional view of a Schottky diode with a uniform JB array according to one embodiment of the disclosure.

FIG. 6A provides an enlarged view of a portion of the active region 14 and is used to help identify the various p-n junctions that come into play during operation of the Schottky diode 10. For this embodiment, assume the JB elements 30 are elongated stripes (as illustrated in FIG. 2). With the presence of the JB elements 30, there are at least two types of junctions about the active region 14. The first is referred to as a Schottky junction J1, and is any metal-semiconductor (m-s) junction between the Schottky layer 24 and those portions of the top surface of the drift layer 22 that do not have a JB element 30. In other words, the Schottky junction J1 is a junction between the Schottky layer 24 and those portions of the top surface of the drift layer that are between two adjacent JB elements 30 or a JB element 30 and the edge guard ring 38 (not shown). The second is referred to as a JB junction J2, and is any p-n junction between a JB element 30 and the drift layer 22.

As the Schottky diode 10 is forward-biased, the Schottky junctions J1 turn on before the JB junctions J2 turn on. At low forward voltages, current transport in the Schottky diode 10 is dominated by majority carriers (electrons) injected across the Schottky junction J1. As such, the Schottky diode 10 acts like a traditional Schottky diode. In this configuration, there is little or no minority carrier injection, and thus no minority charge. As a result, the Schottky diode 10 is capable of fast switching speeds at normal operating voltages.

When the Schottky diode 10 is reverse-biased, depletion regions that form adjacent the JB junctions J2 expand to block reverse current through the Schottky diode 10. As a result, the expanded depletion regions function to both protect the Schottky junction J1 and limit reverse leakage current in the Schottky diode 10. With the JB elements 30, the Schottky diode 10 behaves like a PIN diode.

Figure 6B:
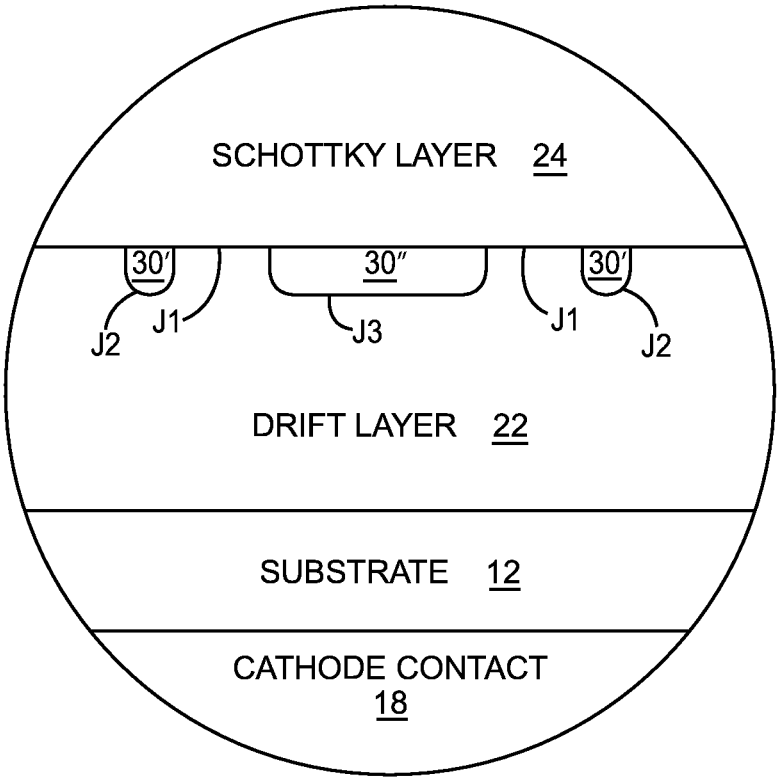
FIG. 6B is a partial cross-sectional view of a Schottky diode with a non-uniform JB array according to another embodiment of the disclosure.

In another embodiment, FIG. 6B provides an enlarged view of a portion of the active region 14 and is used to help identify the various p-n junctions that come into play during operation of the Schottky diode 10. For this embodiment, assume that there are two types of JB elements 30: the striped, lower-doped JB elements 30' and island-shaped, higher-doped JB elements 30" (as illustrated in FIG. 4). Again, the Schottky junction J1 is any metal-semiconductor junction between the Schottky layer 24 and the those portions of the top surface of the drift layer that are between two adjacent JB elements 30 or a JB element 30 and the edge guard ring 38 (not shown). The primary JB junction J2 is any p-n junction between a stripe JB element 30' and the drift layer 22. A secondary JB junction J3 is any p-n junction between an island JB element 30" and the drift layer 22. In this embodiment, assume that the stripe JB elements 30' are doped with a P-type material at a concentration that is the same or lower than the island JB elements 30".

The ratio of the surface area of the active region 14 of the Schottky diode 10 occupied by the lower-doped JB elements 30' and the higher-doped JB elements 30" to the total surface area of the active region 14 may affect both the reverse leakage current and the forward voltage drop of the Schottky diode 10. For example, if the area occupied by lower- and higher-doped JB elements 30', 30" is increased relative to the total area of the active region 14, the reverse leakage current may be reduced, but the forward voltage drop of the Schottky diode 10 may increase. Thus, the selection of the ratio of the surface area of the active region 14 occupied by the lower- and higher-doped JB elements 30' and 30" may entail a trade-off between reverse leakage current and forward voltage drop. In some embodiments, the ratio of the surface area of the active region 14 occupied by the lower- and higher-doped JB elements 30', 30" to the total surface area of the active region 14 may be between about 2% and 40%.

As the Schottky diode 10 is forward biased past a first threshold, the Schottky junction J1 turns on before the primary JB junctions J2 and the secondary JB junctions J3, and the Schottky diode 10 exhibits traditional Schottky diode behavior at low forward-biased voltages. At low forward-biased voltages, the operation of the Schottky diode 10 is dominated by the injection of majority carriers across the Schottky junctions J1. Due to the absence of minority carrier injection under normal operating conditions, the Schottky diode 10 may have very fast switching capability, which is characteristic of Schottky diodes in general.

As indicated, the turn-on voltage for the Schottky junctions J1 is lower than the turn-on voltage for the primary and secondary JB Junctions J2, J3. The lower- and higher-doped JB elements 30', 30" may be designed such that the secondary JB junctions J3 will begin to conduct if the forward-biased voltage continues to increase past a second threshold. If the forward biased voltage increases past the second threshold, such as in the case of a current surge through the Schottky diode 10, the secondary JB junctions J3 will begin to conduct. Once the secondary JB junctions J3 begin to conduct, the operation of the Schottky diode 10 is dominated by the injection and recombination of minority carriers across the secondary junction J3. In this case, the on-resistance of the Schottky diode 10 may decrease, which in turn may decrease the amount of power dissipated by the Schottky diode 10 for a given level of current and may help prevent thermal runaway.

Under reverse bias conditions, the depletion regions formed by the primary and secondary JB junctions J2, J3 may expand to block reverse current through the Schottky diode 10, thereby protecting the Schottky junction J1 and limiting reverse leakage current in the Schottky diode 10. Again, when reverse biased, the Schottky diode 10 may function substantially like a PIN diode.

Notably, the voltage blocking ability of the Schottky diode 10 according to some embodiments of the invention is determined by the thickness and doping of the lower-doped JB elements 30'. When a sufficiently large reverse voltage is applied to the Schottky diode 10, the depletion regions in the lower-doped JB elements 30' will punch through to the depletion region associated with the drift layer 22. As a result, a large reverse current is permitted to flow through the Schottky diode 10. As the lower-doped JB elements 30' are distributed across the active region 14, this reverse breakdown may be uniformly distributed and controlled such that it does not damage the Schottky diode 10.

In essence, the breakdown of the Schottky diode 10 is localized to a punch-through of the lower-doped JB elements 30', which results in a breakdown current that is distributed evenly across the active region 14. As a result, the breakdown characteristic of the Schottky diode 10 may be controlled such that large reverse currents can be dissipated without damaging or destroying the Schottky diode 10. In some embodiments, the doping of the lower-doped JB elements 30' may be chosen such that the punch-through voltage is slightly less than the maximum reverse voltage that may otherwise be supported by the edge termination of the Schottky diode 10.

The design of the edge termination region 16 shown in FIG. 1 further enhances both the forward and reverse current and voltage characteristics of the Schottky diode 10. Notably, electric fields tend to build about the periphery of the Schottky layer 24, especially as the reverse voltage increases. As the electric fields increase, the reverse leakage current increases, the reverse breakdown voltage decreases, and the ability to control the avalanche current when the breakdown voltage is exceeded is decreased. Each of these characteristics runs counter to the need to provide a Schottky diode 10 that has low reverse leakage currents, high reverse breakdown voltages, and controlled avalanche currents. Fortunately, providing the guard rings 36 around the Schottky layer 24, or active region 14, generally tends to reduce the buildup of the electric fields about the periphery of the Schottky layer 24.

Figure 7:
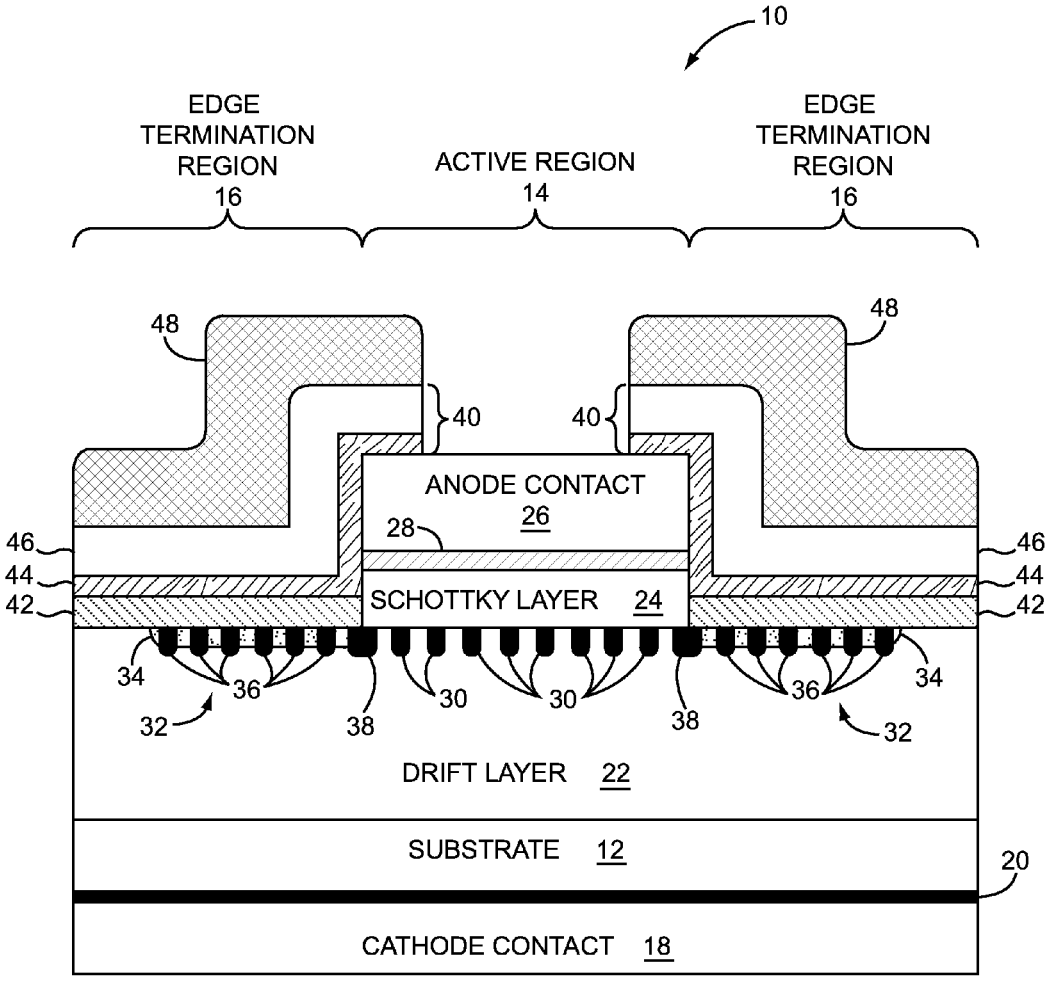
FIG. 7 (RELATED ART)
FIG. 7 is a cross-sectional view of a Schottky diode with a current passivation structure.

In FIG. 7, an existing passivation structure 40 is shown covering the edge termination region 16 as well as the sides and a portion of the top of the contact mesa. The contact mesa resides over the active region 14 and is formed by the Schottky layer 24, barrier layer 28, and the anode contact 26. The passivation structure 40 is intended to protect the top surface of Schottky diode 10 from the deteriorating effects of various environmental elements, such as water, oxygen, and hydrogen.

Before forming the passivation structure 40, an oxide layer 42 is generally formed over the top surface of the drift layer 22 in the edge termination region 16. As such, the oxide layer 42 extends from the Schottky layer 24 outward past the edge termination structure 32. The oxide layer 42 is silicon dioxide $SiO_2$ and is thermally grown.

The passivation structure 40 includes first passivation layer 44 and a second passivation layer 46. The first passivation layer 44 is silicon nitride SiN, which is deposited through a sputtering process. The second passivation layer 46 is also SiN, but is deposited using a plasma enhanced chemical vapor deposition (PECVD) process instead of using a sputtering process. Over the passivation structure 40 resides an encapsulation layer 48, which is formed from a polyimide. A polyimide generally refers to any polymer of imide monomers. The encapsulation layer 48 provides yet another layer of protection from environmental elements. The second passivation layer 46 is greater in thickness than the first passivation layer 44.

Unfortunately, the passivation structure 40 has proven to be susceptible to various environmental conditions over time. The issue is that tiny paths often form in the SiN of the first and second passivation layers 44 and 46. Paths in the first and second passivation layers 44 and 46 may align to allow water, oxygen, and hydrogen to reach and react with the oxide layer 42, especially in those areas of the edge termination region 16 that are subjected to high electric fields. The reaction results in the oxide layer 42 further oxidizing, which tends to raise and crack the passivation structure 40. The cracks further expose the oxide layer 42 and other parts of the Schottky diode to the environment to perpetuate a viscous cycle that leads to deteriorating performance and device failure.

Figure 8:
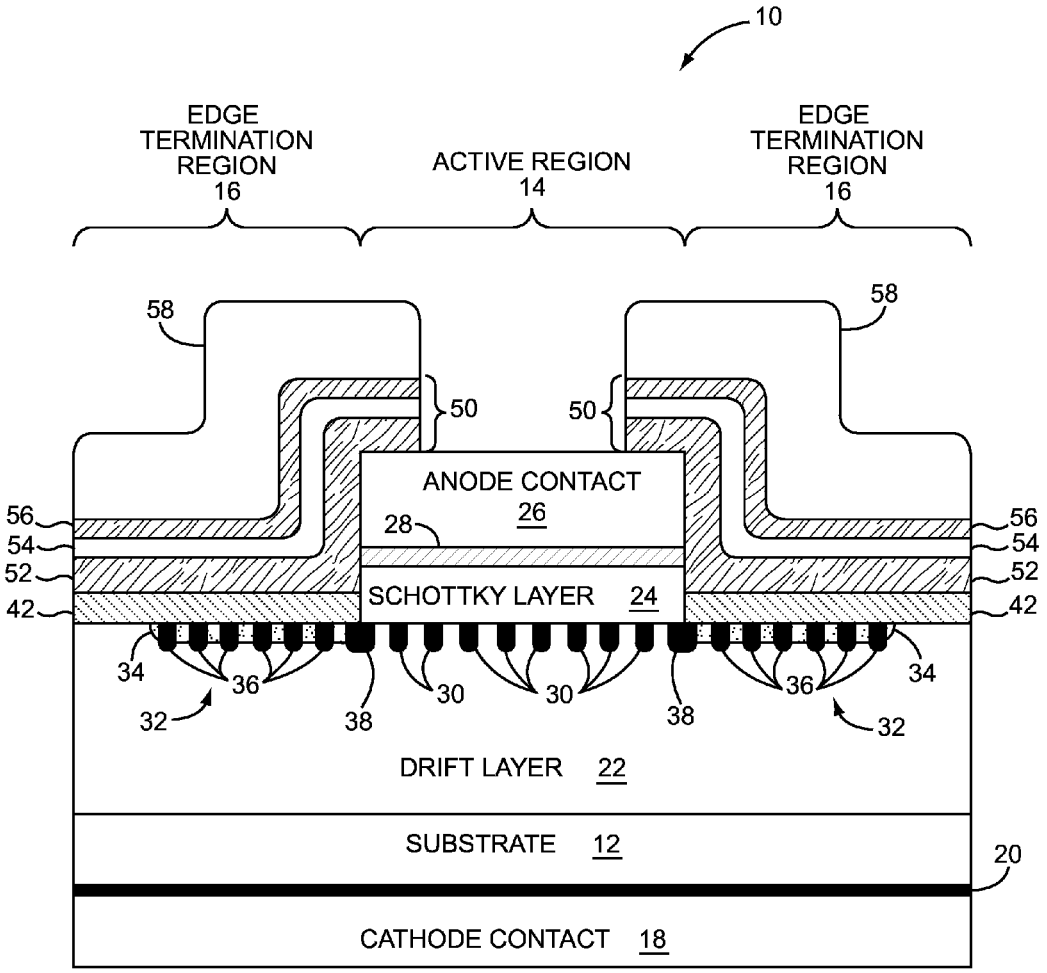
FIG. 8 is a cross-sectional view of a Schottky diode with an improved passivation structure, according to one embodiment of the disclosure.

An improved passivation structure 50 is illustrated in FIG. 8. The passivation structure 50 is shown covering the edge termination region 16 as well as the sides and a portion of the top of the contact mesa. The passivation structure 50 includes a first passivation layer 52, a second passivation layer 54, and a third passivation layer 56, which may be deposited successively in a single deposition run using PECVD, atomic layer deposition (ALD), or like deposition process.

In one embodiment, the first passivation layer 52 is SiN, the second passivation layer 54 is $SiO_2$, and the third passivation layer 56 is SiN. The first passivation layer 52 is deposited using PECVD with a thickness between about 6400 and 9600 Angstroms with a relatively high index of refraction between about 1.85 and 2.25. Alternative thickness ranges for the first passivation layer 52 are between about 7500 and 8500 Angstroms and between about 7800 and 8200 Angstroms. An alternative index of fraction range is between about 1.95 and 2.15.

The second passivation layer 54 is deposited using PECVD with a thickness between about 750 and 1250 Angstroms with a relatively low index of refraction between about 1.4 and 1.6. Alternative thickness ranges for the second passivation layer 54 are between about 800 and 1200 Angstroms and between about 900 and 1100 Angstroms. An alternative index of fraction range is between about 1.45 and 1.5.

The third passivation layer 56 is deposited using PECVD with a thickness between about 2200 and 3800 Angstroms with a relatively high index of refraction between about 1.85 and 2.25. Alternative thickness ranges for the third passivation layer 56 are between about 2400 and 3600 Angstroms and between about 2800 and 3200 Angstroms. An alternative index of fraction range is between about 1.95 and 2.15. In this embodiment, the thickness of the first passivation layer 52 is greater than the thickness of the third passivation layer 56, which is greater than the thickness of the second passivation layer 54. An encapsulation layer 58 is provided over the third passivation layer 56. The encapsulation layer 58 may be a polyimide, organic or polymer-based scratch protectant, or the like.

The cathode ohmic layer 20 is nickel (Ni). The cathode contact 18 may be formed over the cathode ohmic layer 20 with consecutive layers of titanium (Ti), nickel (Ni), and silver (Ag). Other constructions for the cathode ohmic layer 20 and the cathode contact 18 will be appreciated by those skilled in the art.

With the above configuration for the passivation structure 50, the Schottky diode 10 has proven to be surprisingly more resilient to adverse environmental conditions than existing structures. In fact, the passivation structure 50 consistently allows high voltage Schottky diodes 10 to operate without failure at 80% (or greater) of the rated reverse-biased breakdown voltage, 85 Celsius (or greater), and 85% (or greater) humidity for at least 1000 consecutive hours, wherein the rated reverse breakdown voltage is at least 600 volts. By comparison, a Schottky diode 10 that employs the passivation structure 40 (of FIG. 7) will typically fail in less than 100 hours. As such, the improved passivation structure 50 affords a longevity improvement for a high-voltage SiC Schottky diode 10 of an order of magnitude or more over the existing passivation structure 40. Exemplary ratings for the Schottky diode 10 include 600 volts at 1, 2, 3, 4, 6, 8, 10, and 50 amperes; 650 volts at 2, 3, 4, 6, 8, 10, 30, and 50 amperes; and 1200 volts at 2, 5, 8, 10, 15, 20, and 50 amperes. The voltage ratings are for the reverse-biased breakdown voltage and the ampere ratings are for the forward biased current.

While the above embodiments are directed to Schottky diodes 10, all of the contemplated structures and designs are equally applicable to other semiconductor devices that suffer from adverse field effects about the periphery of an active region. Exemplary devices that may benefit from the contemplated structures and designs of the edge termination region 16 include all types of field effect transistors (FETs), insulated gate bipolar transistors (IGBTs), and gate turn-off thyristors (GTOs).

Another characteristic that affects both forward and reverse current and voltage characteristics of the Schottky diode 10 is the barrier height associated with the Schottky junction J1 (FIGS. 6A and 6B), which again, is the metal-semiconductor junction between the metal Schottky layer 24 and the semiconductor drift layer 22. When a metal layer, such as the Schottky layer 24, is in close proximity with a semiconductor layer, such as the drift layer 22, a native potential barrier develops between the two layers. The barrier height associated with the Schottky junction J1 corresponds to the native potential barrier. Absent application of an external voltage, this native potential barrier prevents most charge carriers, either electrons or holes, from moving from one layer to another the other. When an external voltage is applied, the native potential barrier from the semiconductor layer's perspective will effectively increase or decrease. Notably, the potential barrier from the metal layer's perspective will not change when the external voltage is applied.

When a Schottky diode 10 with an N-type drift layer 22 is forward biased, application of a positive voltage at the Schottky layer 24 effectively reduces the native potential barrier and causes electrons to flow from the semiconductor across the metal-semiconductor junction. The magnitude of the native potential barrier, and thus barrier height, bears on the amount of voltage necessary to overcome the native potential barrier and cause the electrons to flow from the semiconductor layer to the metal layer. In effect, the potential barrier is reduced when the Schottky diode is forward biased. When the Schottky diode 10 is reverse biased, the potential barrier is greatly increased and functions to block the flow of electrons.

The material used to form the Schottky layer 24 largely dictates the barrier height associated with the Schottky junction J1. In many applications, a low barrier height is preferred. A lower barrier height allows one of the following. First, a lower barrier height device with a smaller active region 14 can be developed to have the same forward turn on and operating current and voltage ratings as a device having a larger active region 14 and a higher barrier height. In other words, the lower barrier height device with a smaller active region 14 can support the same forward voltage at a given current as a device that has a higher barrier height and a larger active region 14.

Alternatively, a lower barrier height device may have lower forward turn on and operating voltages while handling the same or similar currents as a higher barrier height device when both devices have active regions 14 of the same size. Lower barrier heights also lower the forward biased on-resistances of the devices, which help make the devices more efficient and generate less heat, which can be destructive to the device.

Exemplary metals (including alloys) that are associated with low barrier heights in Schottky applications that employ a SiC drift layer 22 include, but are not limited to tantalum (Ta), titanium (Ti), chromium (Cr), and aluminum (Al), where tantalum is associated with the lowest barrier height of the group. These metals are defined as low barrier height cable metals. While the barrier height is a function of the metal used for the Schottky layer 24, the material used for the drift layer 22, and perhaps the extent of doping in the drift layer 22, exemplary barrier heights that may be achieved with certain embodiments are less than 1.2 election volts (eV), less than 1.1 eV, less than 1.0 eV, less than 0.9 eV, and less than about 0.8 eV.

Turning now to FIGS. 9 through 23, an exemplary process for fabricating a Schottky diode 10, such as the one illustrated in FIG. 8, is provided. In this example, assume that the JB elements 30 are elongated stripes, as illustrated in FIG. 2. Through the description of the process, exemplary materials, doping types, doping levels, structure dimensions, and the selected alternatives are outlined. These aspects are merely illustrative, and the concepts disclosed herein and the claims that follow are not limited to these aspects.

Figure 9:
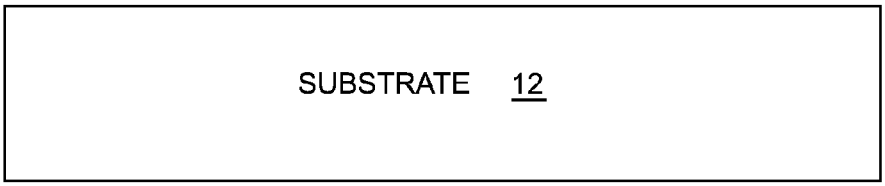
FIGS. 9 through 23 illustrate select processing steps for fabricating a Schottky diode according to the embodiment illustrated in FIG. 8.

The process starts by providing an N-doped, single crystal, 4H SiC substrate 12, as shown in FIG. 9. The substrate 12 may have various crystalline polytypes, such as 2H, 4H, 6H, 3C and the like. The substrate 12 may also be formed from other material systems, such as gallium nitride (GaN), gallium arsenide (GaAs), silicon (Si), germanium (Ge), SiGe, and the like. The resistivity of the N-doped, SiC substrate 12 is between about 10 milliohm-cm and 30 milliohm-cm in one embodiment. The initial substrate 12 may have a thickness between about 200 microns and 500 microns.

Figure 10:
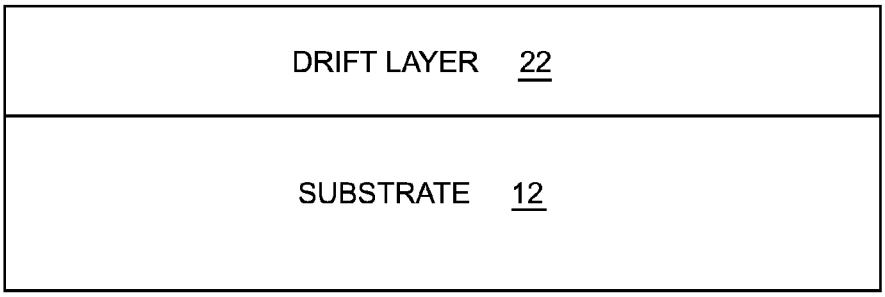

The drift layer 22 may be grown over the substrate 12 and doped in situ, wherein the drift layer 22 is doped as it is grown with an N-type doping material, as shown in FIG. 10. Notably, one or more buffer layers (not shown) may be formed on the substrate 12 prior to forming the drift layer 22. The buffer layer may be used as a nucleation layer and be relatively heavily doped with an N-type doping material. The buffer layer may range from 0.5 to 5 microns in certain embodiments.

The drift layer 22 may be relatively uniformly doped throughout or may employ graded doping throughout all or a portion thereof. For a uniformly doped drift layer 22, the doping concentration may be between about $2\times10^{15}$ $cm^{-3}$ and $1\times10^{16}$ $cm^{-3}$ in one embodiment. With graded doping, the doping concentration is highest at the bottom of the drift layer 22 near the substrate 12 and lowest at the top of the drift layer 22 near the Schottky layer 24. The doping concentration generally decreases in a stepwise or continuous fashion from a point at or near the bottom to a point at or near the top of the drift layer 22. In one embodiment employing graded doping, the lower portion of the drift layer 22 may be doped at a concentration of about $1\times10^{15}$ $cm^{-3}$ and the upper portion of the drift layer 22 maybe doped at a concentration of about $5\times10^{16}$ $cm^{-3}$. In another embodiment employing graded doping, the lower portion of the drift layer 22 may be doped at a concentration of about $5\times10^{15}$ $cm^{-3}$ and the upper portion of the drift layer 22 may be doped at a concentration of about $1\times10^{16}$ $cm^{-3}$.

The drift layer 22 may be between four and ten microns thick in select embodiments, depending on the desired reverse breakdown voltage. In one embodiment, the drift layer 22 is about one micron thick per 100 volts of desired reverse breakdown voltage. For example, a Schottky diode 10 with a reverse breakdown voltage of 600 volts may have a drift layer 22 with a thickness of about six microns.

Figure 11:
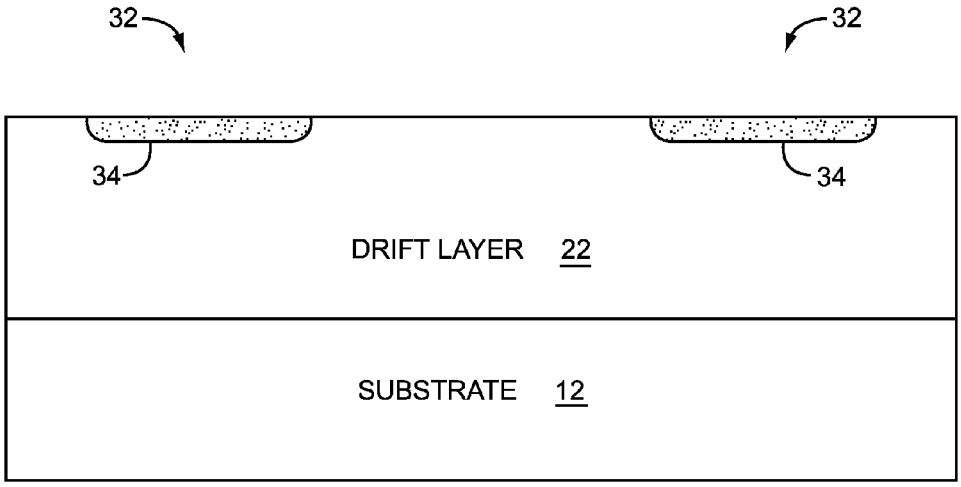

Next, the well 34 is formed by selectively implanting a portion of the drift layer 22 with a P-type material, as shown in FIG. 11. For example, a Schottky diode 10 with a reverse breakdown voltage of 600 volts and capable of handling a sustained forward current of 50 A may have a well 34 that is lightly doped at a concentration between about $5\times10^{16}$ $cm^{-3}$ and $2\times10^{17}$ $cm^{-3}$. The well 34 may be between about 0.1 and 0.5 microns deep and have a width substantially corresponding to the width of the edge termination structure 32.

Figure 12:
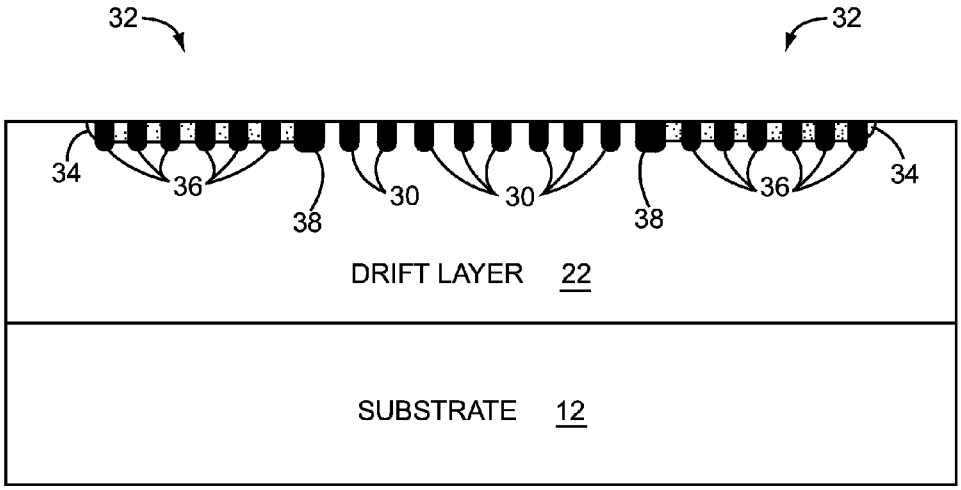

Once the well 34 is formed, the JB elements 30, the edge guard ring 38, and the guard rings 36 are formed by selectively implanting the corresponding portions of the top surface of the drift layer 22 with a P-type material, as shown in FIG. 12. The JB elements 30, the edge guard ring 38, and the guard rings 36 are relatively heavily doped and may be formed at the same time using the same ion implantation process. In one embodiment, a Schottky diode 10 with a reverse breakdown voltage of 600 volts and capable of handling a sustained forward current of 50 A may have the JB elements 30, the edge guard ring 38, and the guard rings 36 all doped at a concentration between about $5\times10^{17}$ $cm^{-3}$ and $5\times10^{19}$ $cm^{-3}$.

In other embodiments, these elements may be doped at different concentrations using the same or different ion implantation process; for example, when the JB array of JB elements 30 includes different shapes or sizes, as provided in FIGS. 4 and 5, or where the different JB elements 30 have different depths. The depth and spacing between adjacent JB elements 30, between the edge guard ring 38 and a JB element 30, and between adjacent guard rings 36 may vary based on desired device characteristics. For example, the depth of these elements may range from 0.2 to greater than 1.5 microns, and the respective elements may be spaced apart from each other between about one and four microns.

Figure 13:
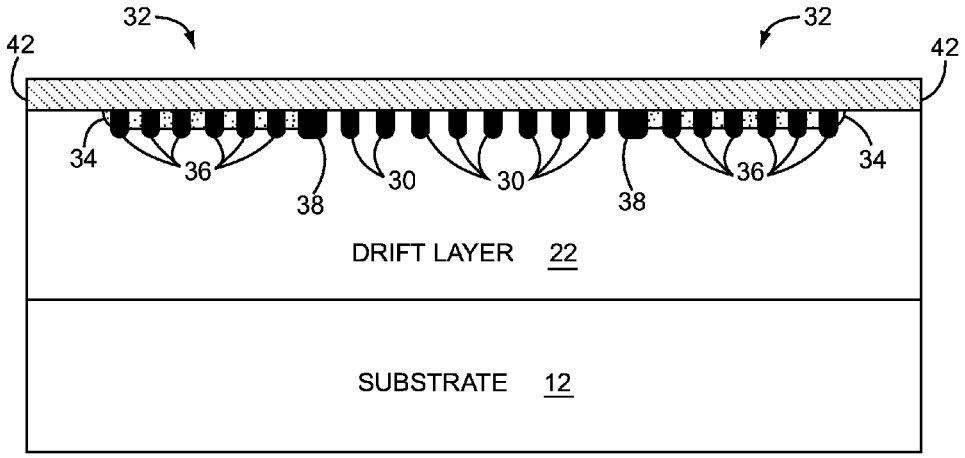
Figure 14:
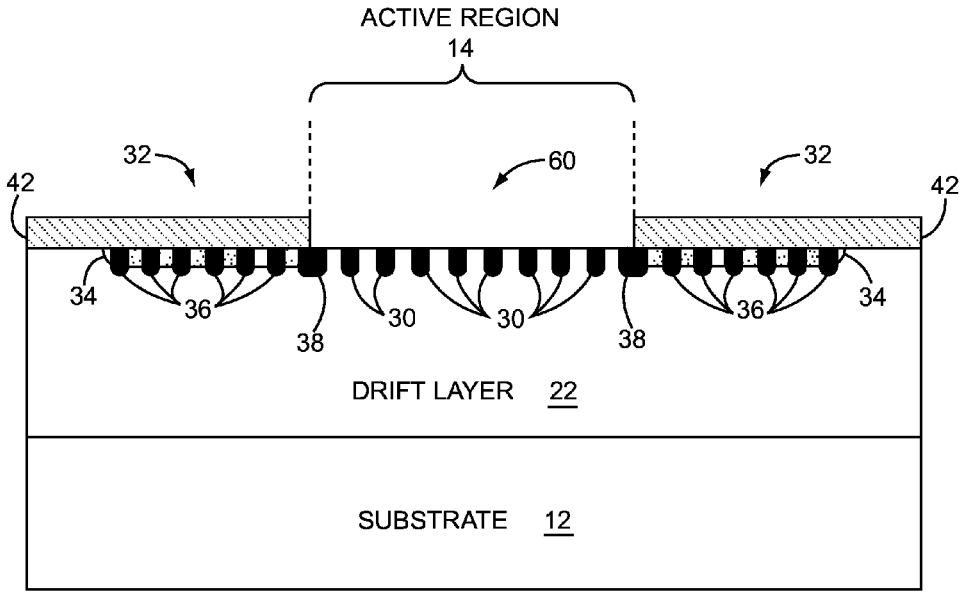

As illustrated in FIG. 13, a thermal oxide layer 42 is formed over the top surface of the drift layer 22. For a SiC drift layer 22, the oxide is silicon dioxide ($SiO_2$). Next, the portion of the thermal oxide layer 42 associated with the active region 14 is removed, as shown in FIG. 14, to form a Schottky recess 60 in which the Schottky layer 24 will be formed.

Figure 15:
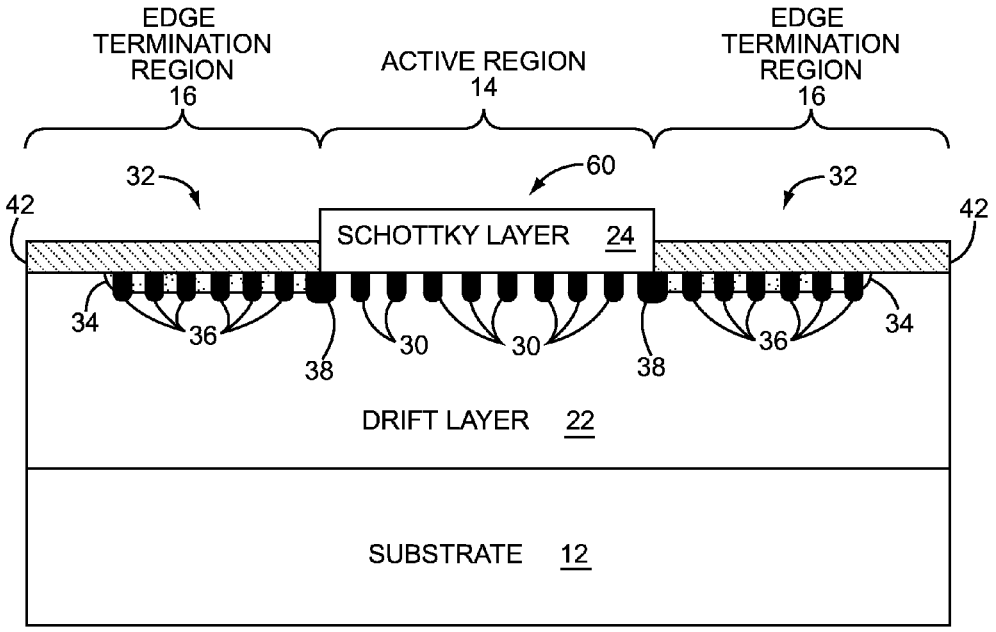
Figure 16:
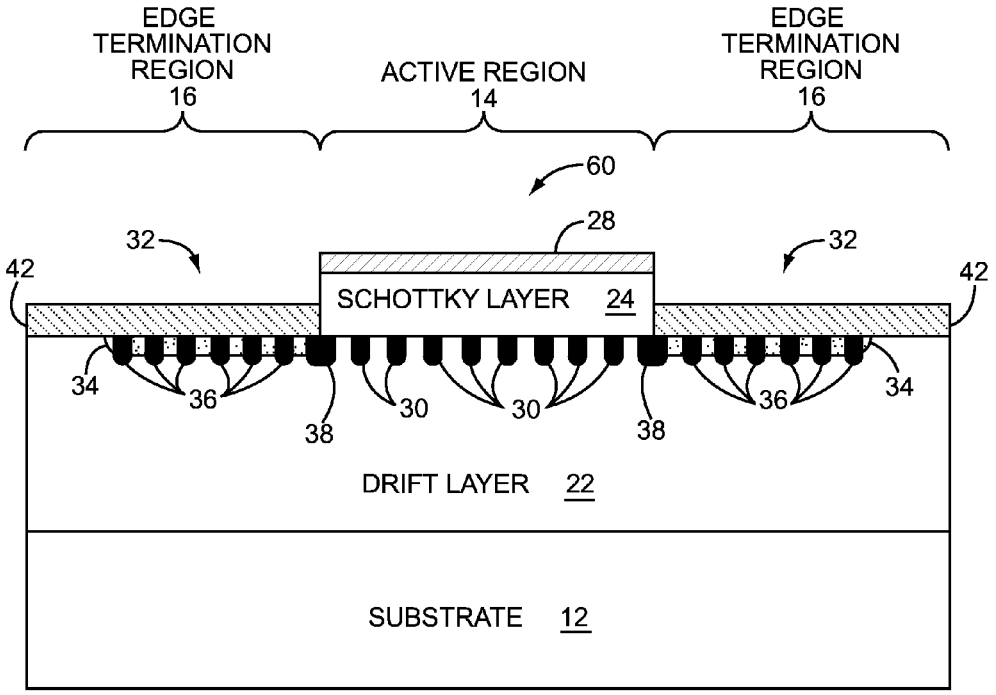

Once the Schottky recess 60 is formed, the Schottky layer 24 is formed over the portion of drift layer 22 that was exposed by the Schottky recess 60, as illustrated in FIG. 15. The thickness of the Schottky layer 24 will vary based on desired device characteristics and the metal used to form the Schottky layer 24, but will generally be between about 100 and 4500 angstroms. For the referenced 600V device, a Schottky layer 24 formed of titanium (Ti) may be between about 500 and 2500 angstroms; a Schottky layer 24 formed of tantalum (Ta) may be between about 200 and 1200 angstroms; and a Schottky layer 24 formed of aluminum (Al) may be between about 3500 and 4500 angstroms. Depending on the metal used for the Schottky layer 24 and the to-be-formed anode contact 26, one or more barrier layers 28 may be formed over the Schottky layer 24, as shown in FIG. 16. The barrier layer 28 may be formed of tantalum (Ta), titanium tungsten alloy (TiW), titanium nickel alloy (TiN), and any other suitable material, and may be between about 75 and 400 angstroms thick in select embodiments. The barrier layer 28 helps prevent diffusion between the metals used to form the Schottky layer 24 and the to-be-formed anode contact 26. Notably, the barrier layer 28 is not used in certain embodiments where the Schottky layer 24 is tantalum (Ta) and the to-be-formed anode contact 26 is formed from aluminum (Al). The barrier layer 28 is generally beneficial in embodiments where the Schottky layer 24 is titanium (Ti) and the to-be-formed anode contact 26 is formed from aluminum (Al). Tantalum (Ta) is a good material for the barrier layer in this configuration.

Figure 17:
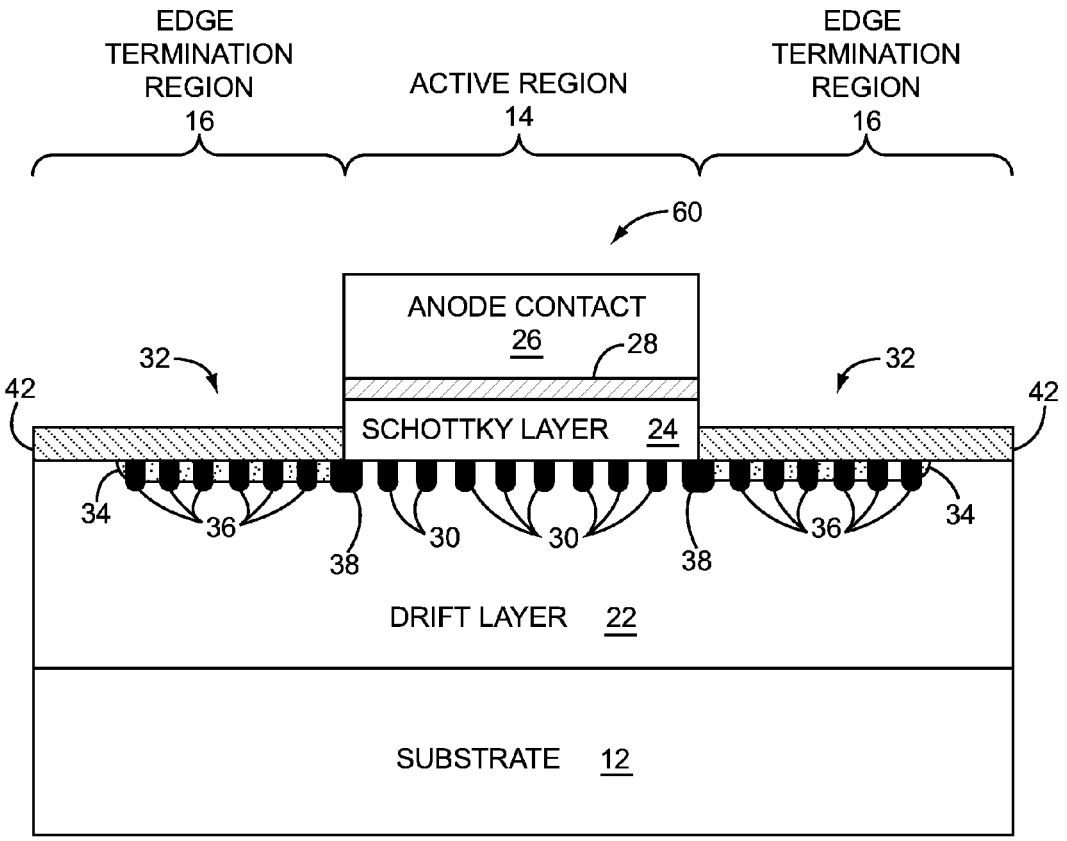

Next, the anode contact 26 is formed over the Schottky layer 24, or if present, the barrier layer 28, as shown in FIG. 17. The anode contact 26 is generally relatively thick, formed from a metal, and acts as a bond pad for the anode of the Schottky diode 10. The anode contact 26 may be formed from aluminum (Al), gold (Au), Silver (Ag), and the like.

Figure 18:
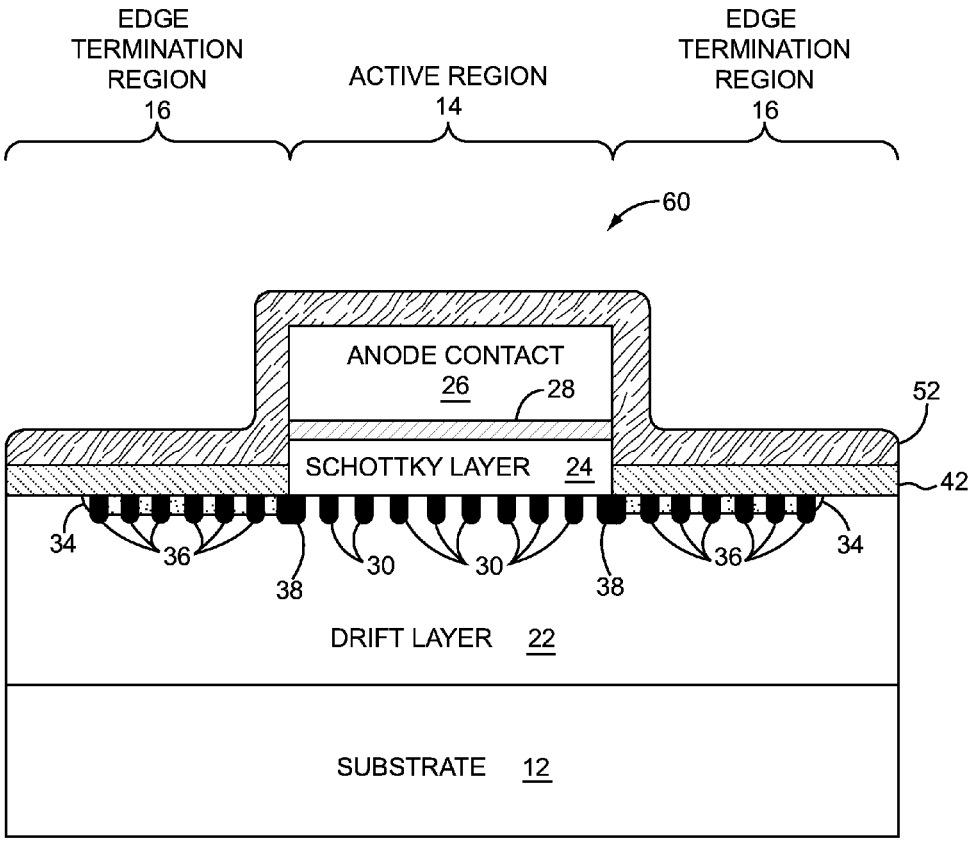
Figure 19:
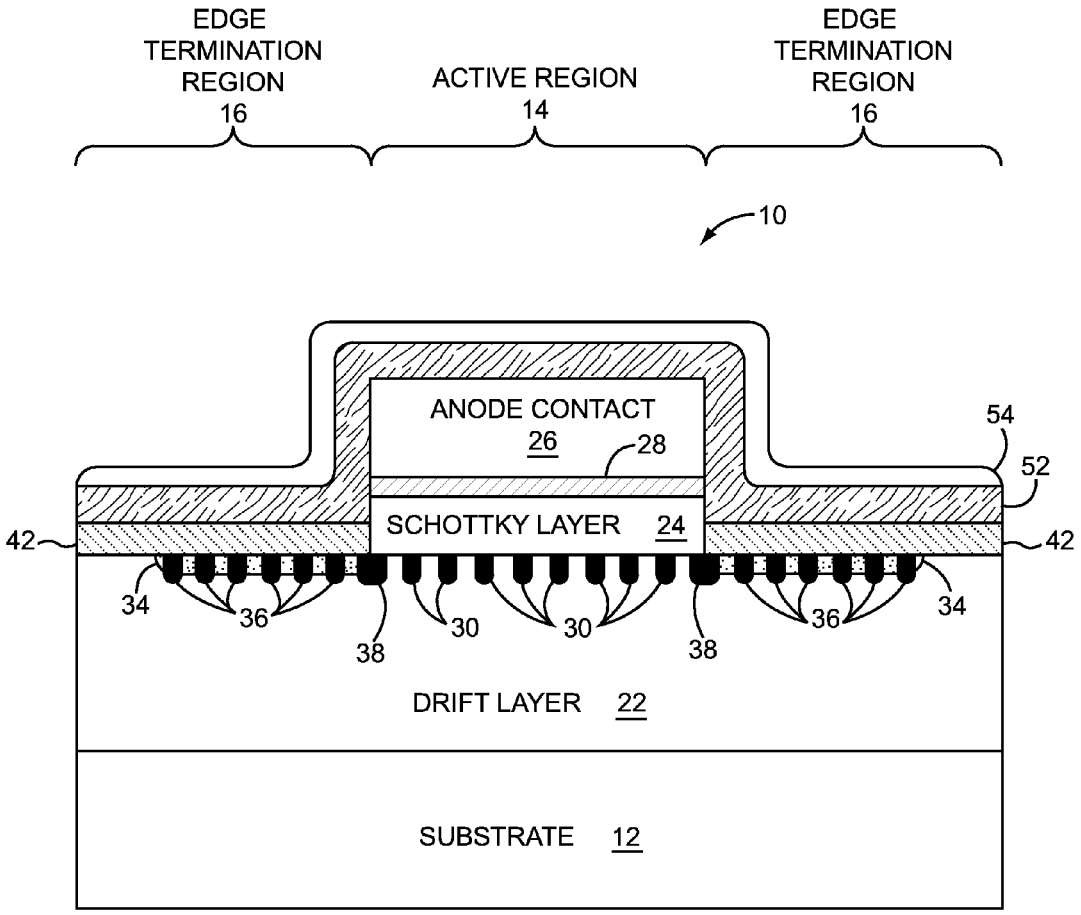
Figure 20:
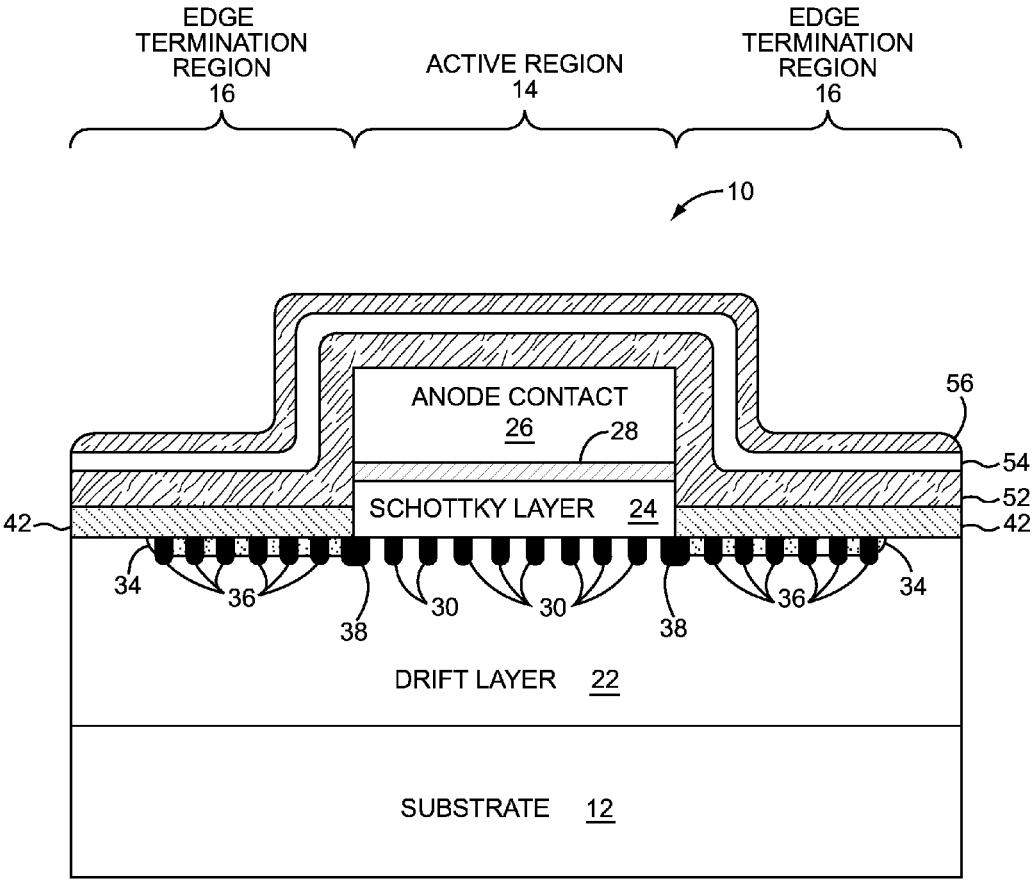
Figure 21:
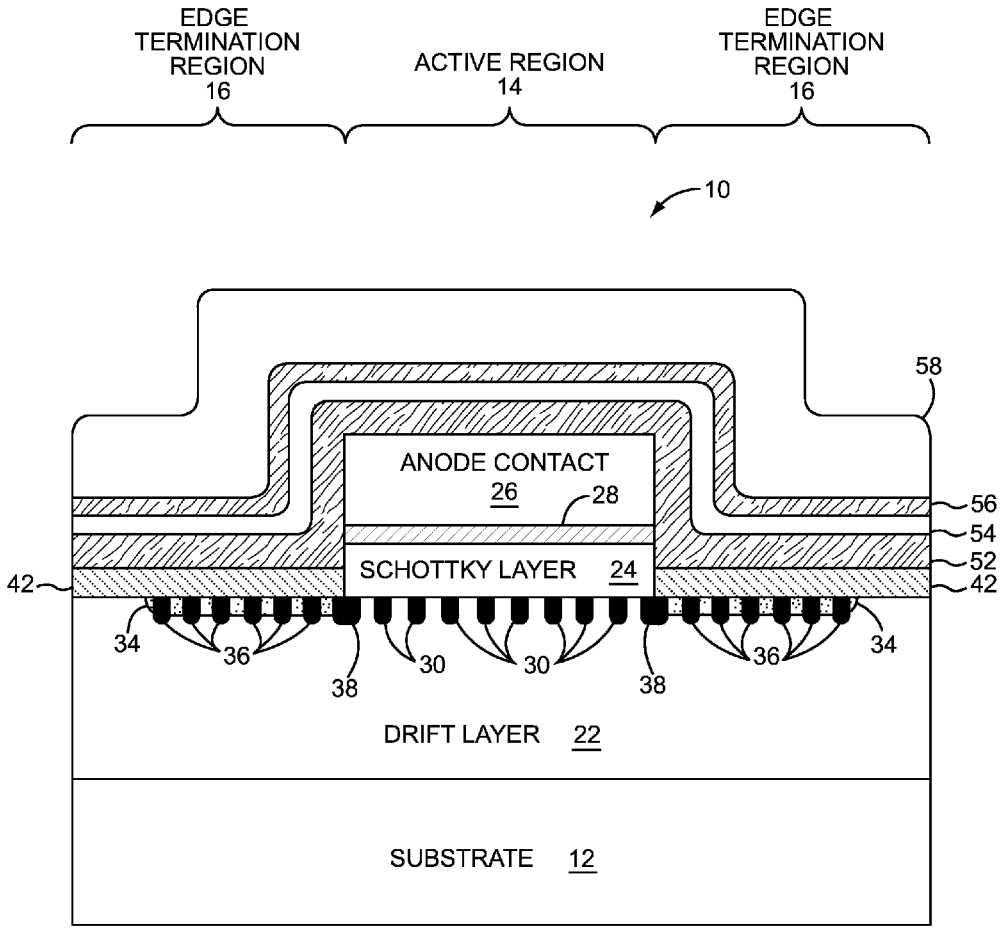
Figure 22:
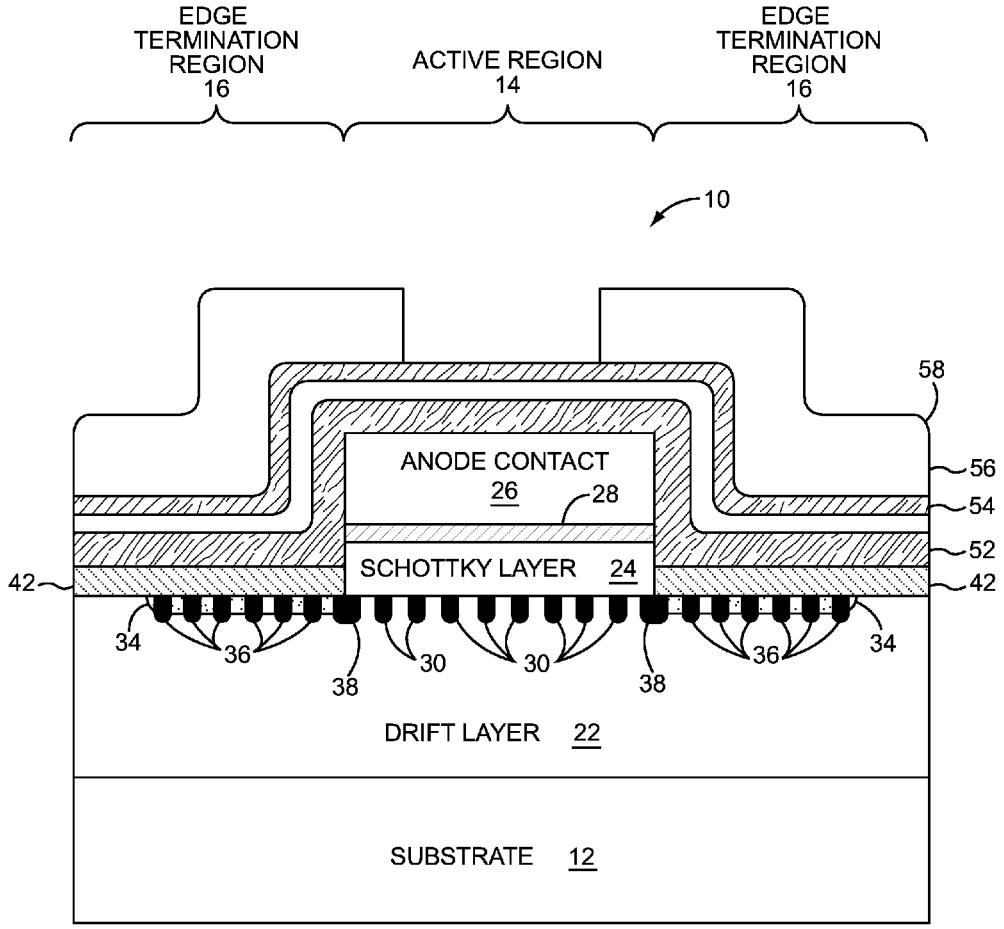

As shown in FIGS. 18, 19, and 20, the first, second, and third passivation layers 52, 54, 56 may be sequentially formed in a single PECVD process. In one embodiment, the first passivation layer 52 is silicon nitride (SiN), the second passivation layer 54 is silicon dioxide ($SiO_2$), and the third passivation layer 56 is silicon nitride (SiN). As shown in FIG. 21, the encapsulation layer 58 is formed over the third passivation layer 56. The encapsulation layer 58 is a polyimide in one embodiment, and can be etched using photolithography. As such, an area of the encapsulation layer 58 that is over a central portion of the anode contact 26 is etched away to expose a portion of the third passivation layer 56, as shown in FIG. 22.

Figure 23:
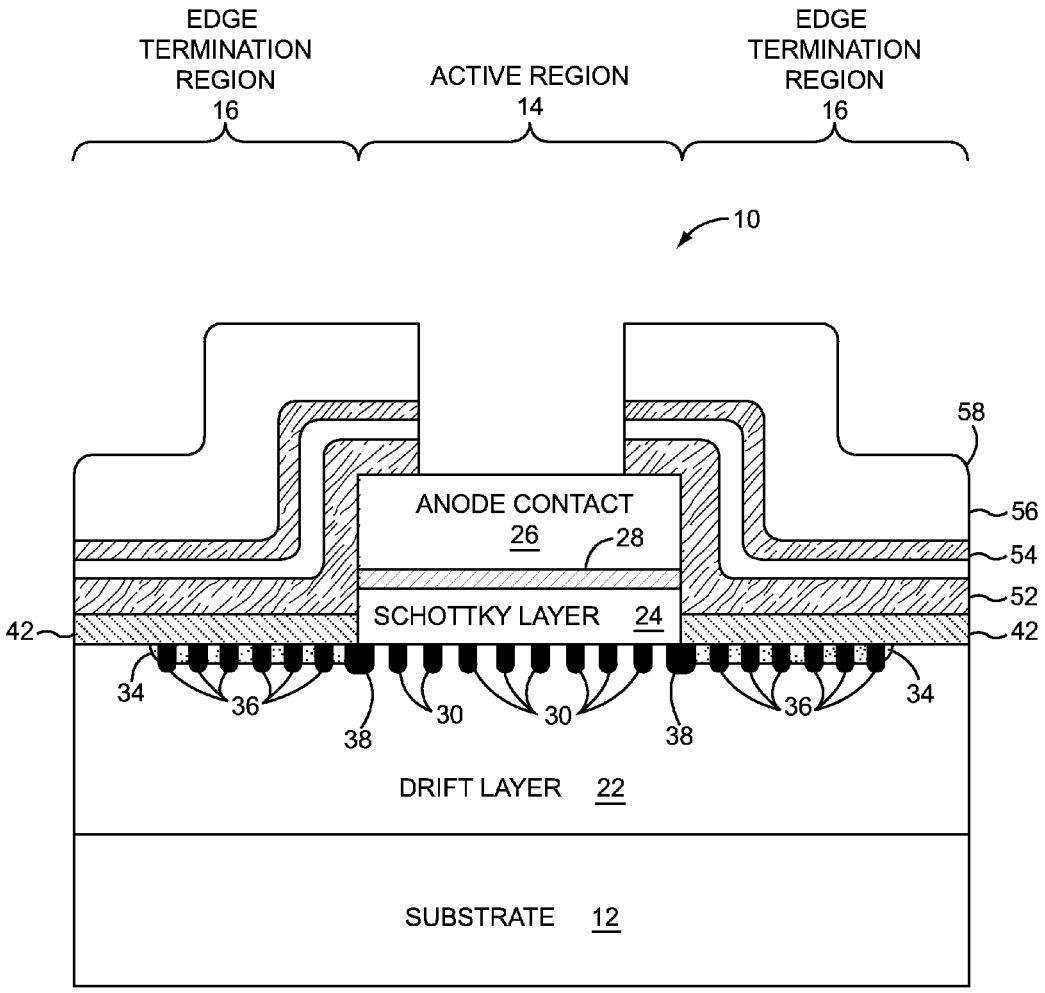

The remaining portion of the encapsulation layer 58 may at act as mask for etching away those portions of the first, second, and third passivation layers 52, 54, and 56 that reside over that central portion of the anode contact 26. Once etched, the central portion of the anode contact 26 is exposed as shown in FIG. 23. Ultimately, bond wires or the like may be soldered or otherwise connected to the top surface of the anode contact 26 through the opening that exposed the central portion of the anode contact 26.

At this point, processing switches from the front side (top) of the Schottky diode 10 to the back side (bottom) of the Schottky diode 10. While not illustrated, the substrate 12 is substantially thinned by removing a bottom portion of the substrate 12 though a grinding, etching, or like process. For the 600V reference Schottky diode 10, the substrate 12 may be thinned to a thickness between about 50 and 200 microns in a first embodiment, and between about 75 and 125 microns in a second embodiment. Thinning the substrate 12 or otherwise employing a thin substrate 12 reduces the overall electrical and thermal resistance between the anode and cathode of the Schottky diode 10 and allows the device to handle higher current densities without overheating.

Finally, the cathode ohmic layer 20 is formed on the bottom of the thinned substrate 12 with an ohmic metal, such as nickel (Ni), nickel silicide (NiSi), and nickel aluminide (NiAl). In embodiments where the encapsulation layer 58 is employed, the cathode ohmic layer 20 may be laser annealed instead of baking the entire device at a high temperature to anneal the ohmic metal. Laser annealing allows the ohmic metal to be heated sufficiently for annealing, yet does not heat the rest of the device to temperatures that would otherwise damage or destroy the encapsulation layer 58. Once the cathode ohmic layer 20 is formed and annealed, the cathode contact 18 is formed over the cathode ohmic layer 20 to provide a solder or like interface for the Schottky diode 10. In one embodiment, the cathode contact 18 may be formed over the cathode ohmic layer 20 with consecutive layers of titanium (Ti), nickel (Ni), and silver (Ag) wherein silver (Ag) is the outermost layer.

With the concepts disclosed herein, very high performance Schottky diodes 10 may be designed for various applications that require various operation parameters. The current density associated with DC forward-biased currents may exceed 440 amperes/cm in certain embodiments, and may exceed 500 amperes/cm in other embodiments. Further, Schottky diodes 10 may be constructed to have a ratio of DC forward-biased current density to reverse-biased anode-cathode capacitance greater than 0.275, 0.3, 0.325, 0.35, 0.375, and 0.4 ampere/pico-Farad (A/pF) in various embodiments, wherein the reverse-biased anode-cathode voltage is determined when the Schottky diode is reverse biased to a point where the active region is essentially fully depleted.

Those skilled in the art will recognize improvements and modifications to the embodiments of the present disclosure. All such improvements and modifications are considered within the scope of the concepts disclosed herein and the claims that follow.

What is claimed is:

1. A Schottky diode comprising:

a silicon carbide substrate;

a silicon carbide drift layer over the silicon carbide substrate and providing an active region and an edge termination region about the active region;

a Schottky contact having sides and a top extending between the sides and comprising a Schottky layer over the active region and an anode contact over the Schottky layer; and a passivation structure comprising a first silicon nitride layer, a silicon dioxide layer over the first silicon nitride layer, and a second silicon nitride layer over the silicon dioxide layer, wherein the first silicon nitride layer, the silicon dioxide layer, and the second silicon nitride layer are plasma enhanced chemical vapor deposition layers such that a thickness of the first silicon nitride layer is greater than a thickness of the second silicon nitride layer and the passivation structure covers the edge termination region, the sides of the Schottky contact, and at least a portion of the top of the Schottky contact.

2. The Schottky diode of claim 1 further comprising an oxide layer between the passivation structure and the silicon carbide drift layer and extending outward from the sides of the Schottky contact over the edge termination region.

3. The Schottky diode of claim 2 wherein the oxide layer does not cover the top of the Schottky contact and portions of the sides of the Schottky contact that extend above the oxide layer.

4. The Schottky diode of claim 3 wherein the oxide layer is a thermally grown silicon dioxide layer.

5. The Schottky diode of claim 2 wherein the oxide layer is a thermally grown silicon dioxide layer.

6. The Schottky diode of claim 1 further comprising a cathode contact on a bottom side of the silicon carbide substrate opposite the silicon carbide drift layer.

7. The Schottky diode of claim 1 wherein the Schottky contact further comprises a tantalum barrier layer between the anode contact and the Schottky layer.

8. The Schottky diode of claim 1 further comprising an encapsulation layer over the passivation structure.

9. The Schottky diode of claim 8 wherein the encapsulation layer is a polyimide layer.

10. The Schottky diode of claim 1 wherein the thickness of the second silicon nitride layer is greater than a thickness of the silicon dioxide layer.

11. The Schottky diode of claim 1 wherein the thickness of the first silicon nitride layer is between about 6400 and 9600 Angstroms, a thickness of the silicon dioxide layer is between about 900 and 1100 Angstroms, and the thickness of the second silicon nitride layer is between about 2400 and 3600 Angstroms.

12. The Schottky diode of claim 11 wherein an index of refraction for the first silicon nitride layer is between about 1.95 and 2.15, an index of refraction for the silicon dioxide layer is between about 1.45 and 1.5, and an index of refraction for the second silicon nitride layer is between about 1.95 and 2.15.

13. The Schottky diode of claim 1 wherein an index of refraction for the first silicon nitride layer is between about 1.95 and 2.15, an index of refraction for the silicon dioxide layer is between about 1.45 and 1.5, and an index of refraction for the second silicon nitride layer is between about 1.95 and 2.15.

14. The Schottky diode of claim 1 further comprising an oxide layer that extends outward from the sides of the Schottky contact over the edge termination region, and wherein for the passivation structure, the first silicon nitride layer is directly on the oxide layer, the silicon dioxide layer is directly on the first silicon nitride layer, and the second silicon nitride layer is directly on the silicon dioxide layer.

15. The Schottky diode of claim 14 wherein the oxide layer is a thermally grown silicon dioxide layer that does not cover the top of the Schottky contact and portions of the sides of the Schottky contact that extend above the silicon dioxide layer.

16. The Schottky diode of claim 1 wherein the Schottky diode has a rated reverse breakdown voltage and can operate at 80% of the rated reverse breakdown voltage, at 85% humidity, and at 85 Celsius for at least 1000 hours without failing.

17. The Schottky diode of claim 1 wherein the Schottky diode has a rated reverse breakdown voltage of at least 600 V.

18. A method for fabricating a Schottky diode comprising:

providing a silicon carbide substrate with a silicon carbide drift layer over the silicon carbide substrate, the silicon carbide drift layer having an active region and an edge termination region about the active region;

forming a Schottky contact over the active region, the Schottky contact having sides and a top extending between the sides and comprising a Schottky layer over the active region and an anode contact over the Schottky layer; and forming a passivation structure comprising a first silicon nitride layer, a silicon dioxide layer over the first silicon nitride layer, and a second silicon nitride layer over the silicon dioxide layer, wherein the first silicon nitride layer, the silicon dioxide layer, and the second silicon nitride layer are plasma enhanced chemical vapor deposition layers such that a thickness of the first silicon nitride layer is greater than a thickness of the second silicon nitride layer and the passivation structure covers the edge termination region, the sides of the Schottky contact, and at least a portion of the top of the Schottky contact.

19. The method of claim 18 wherein the first silicon nitride layer, the silicon dioxide layer, and the second silicon nitride layer are successively formed during a single plasma enhanced chemical vapor deposition process.

20. The method of claim 18 further comprising forming an oxide layer that extends outward from the sides of the Schottky contact over the edge termination region prior to forming the passivation structure.

21. The method of claim 20 wherein the oxide layer does not cover the top of the Schottky contact and portions of the sides of the Schottky contact that extend above the oxide layer.

22. The method of claim 21 wherein the oxide layer is a thermally grown silicon dioxide layer.

23. The method of claim 20 wherein the oxide layer is a thermally grown silicon dioxide layer.

24. The method of claim 18 further comprising forming a cathode contact on a bottom side of the silicon carbide substrate opposite the silicon carbide drift layer.

25. The method of claim 24 wherein the thickness of the first silicon nitride layer is greater than a thickness of the silicon dioxide layer.

26. The method of claim 18 wherein the thickness of the first silicon nitride layer is between about 6400 and 9600 Angstroms, a thickness of the silicon dioxide layer is between about 900 and 1100 Angstroms, and the thickness of the second silicon nitride layer is between about 2400 and 3600 Angstroms.

27. The method of claim 26 wherein an index of refraction for the first silicon nitride layer is between about 1.95 and 2.15, an index of refraction for the silicon dioxide layer is between about 1.45 and 1.5, and an index of refraction for the second silicon nitride layer is between about 1.95 and 2.15.

28. The method of claim 18 wherein the Schottky diode has a rated reverse breakdown voltage and can operate at 80% of the rated reverse breakdown voltage, at 85% humidity, and at 85 Celsius for at least 1000 hours without failing.

29. The method of claim 18 wherein the Schottky diode has a rated reverse breakdown voltage of at least 600 V.

30. The method of claim 18 further comprising forming a polyimide layer over the passivation structure.

31. The method of claim 18 further comprising forming an oxide layer that extends outward from the sides of the Schottky contact over the edge termination region prior to forming the passivation structure, and wherein the first silicon nitride layer is directly on the oxide layer, the silicon dioxide layer is directly on the first silicon nitride layer, and the second silicon nitride layer is directly on the silicon dioxide layer.

32. The method of claim 18 wherein the oxide layer is a thermally grown silicon dioxide layer that does not cover the top of the Schottky contact and portions of the sides of the Schottky contact that extend above the silicon dioxide layer.

33. The method of claim 18 wherein the thickness of the second silicon nitride layer is greater than a thickness of the silicon dioxide layer.

34. The method of claim 18 wherein an index of refraction for the first silicon nitride layer is between about 1.95 and 2.15, an index of refraction for the silicon dioxide layer is between about 1.45 and 1.5, and an index of refraction for the second silicon nitride layer is between about 1.95 and 2.15.

35. The method of claim 18 further comprising forming a tantalum barrier layer between the anode contact and the Schottky layer.

*36. A semiconductor device comprising:*

*a silicon carbide substrate;*

*a silicon carbide drift layer over the silicon carbide substrate;*

*a contact on the silicon carbide drift layer, the contact having sides and a top extending between the sides; and*

*a passivation structure covering the sides of the contact and at least a portion of the top of the contact, the passivation structure comprising a first silicon nitride layer, a silicon dioxide layer on the first silicon nitride layer, and a second silicon nitride layer on the silicon dioxide layer, wherein:*

*the first silicon nitride layer, the silicon dioxide layer, and the second silicon nitride layer are plasma enhanced chemical vapor deposition layers; and*

*a thickness of the first silicon nitride layer is greater than a thickness of the second silicon nitride layer.*

*37. The semiconductor device of claim 36 wherein the silicon carbide drift layer provides an active region and an edge termination region about the active region.*

*38. The semiconductor device of claim 37 wherein the passivation structure covers the edge termination region.*

*39. The semiconductor device of claim 38 further comprising an oxide layer between the passivation structure and the silicon carbide drift layer, the oxide layer extending outward from the sides of the contact over the edge termination region.*

*40. The semiconductor device of claim 39 wherein the oxide layer does not cover the top of the contact and portions of the sides of the contact that extend above the oxide layer.*

*41. The semiconductor device of claim 40 wherein the oxide layer is a thermally grown silicon dioxide layer.*

*42. The semiconductor device of claim 39 wherein the oxide layer is a thermally grown silicon dioxide layer.*

*43. The semiconductor device of claim 36 further comprising an additional contact on the silicon carbide substrate opposite the drift layer.*

*44. The semiconductor device of claim 36 further comprising an encapsulation layer over the passivation structure.*

*45. The semiconductor device of claim 44 wherein the encapsulation layer is a polyimide layer.*

*46. The semiconductor device of claim 36 wherein the thickness of the second silicon nitride layer is greater than a thickness of the silicon dioxide layer.*

*47. The semiconductor device of claim 46 wherein:*

*the thickness of the first silicon nitride layer is between about 6400 and 9600 Angstroms;*

*the thickness of the silicon dioxide layer is between about 900 and 1100 Angstroms; and*

*the thickness of the second silicon nitride layer is between about 2400 and 3600 Angstroms.*

*48. The semiconductor device of claim 47 wherein:*

*an index of refraction for the first silicon nitride layer is between about 1.95 and 2.15;*

*an index of refraction for the silicon dioxide layer is between about 1.45 and 1.5; and*

*an index of refraction for the second silicon nitride layer is between about 1.95 and 2.15.*

*49. The semiconductor device of claim 36 wherein:*

*an index of refraction for the first silicon nitride layer is between about 1.95 and 2.15;*

*an index of refraction for the silicon dioxide layer is between about 1.45 and 1.5; and*

*an index of refraction for the second silicon nitride layer is between about 1.95 and 2.15.*

*50. The semiconductor device of claim 38 further comprising an oxide layer that extends outward from the sides of the contact over the edge termination region, wherein the first silicon nitride layer is directly on the oxide layer, the silicon dioxide layer is directly on the first silicon nitride layer, and the second silicon nitride layer is directly on the silicon dioxide layer.*

*51. The semiconductor device of claim 50 wherein the oxide layer is a thermally grown silicon dioxide layer that does not cover the top of the contact and portions of the sides of the contact that extend above the silicon dioxide layer.*

* * * * *